US007627482B2

(12) United States Patent
Tsuji et al.

(10) Patent No.: US 7,627,482 B2
(45) Date of Patent: Dec. 1, 2009

(54) METHODS, STORAGE MEDIUM, AND APPARATUS FOR ENCODING AND DECODING SOUND SIGNALS FROM MULTIPLE CHANNELS

(75) Inventors: Minoru Tsuji, Chiba (JP); Shiro Suzuki, Kanagawa (JP); Keisuke Toyama, Tokyo (JP)

(73) Assignee: Sony Corporation, Tokyo (JP)

( * ) Notice: Subject to any disclaimer, the term of this patent is extended or adjusted under 35 U.S.C. 154(b) by 1 day.

(21) Appl. No.: 11/951,056

(22) Filed: Dec. 5, 2007

(65) Prior Publication Data

US 2008/0082325 A1 Apr. 3, 2008

Related U.S. Application Data

(62) Division of application No. 10/484,230, filed as application No. PCT/JP03/05909 on May 12, 2003.

(30) Foreign Application Priority Data

May 20, 2002 (JP) ............................ 2002-145267

(51) Int. Cl.
*G10L 19/00* (2006.01)
*G10L 21/00* (2006.01)
*G10L 21/04* (2006.01)
*H03M 7/00* (2006.01)

(52) U.S. Cl. ....................... 704/503; 704/216; 704/500; 704/504; 341/50

(58) Field of Classification Search ................. 704/216, 704/503, 504

See application file for complete search history.

(56) References Cited

U.S. PATENT DOCUMENTS 5,682,461 A 10/1997 Silzle et al.
6,356,211 B1 * 3/2002 Shimoyoshi et al. .......... 341/50

FOREIGN PATENT DOCUMENTS

EP 0 563 832 10/1993

(Continued)

*Primary Examiner*—David R Hudspeth
*Assistant Examiner*—Justin W Rider
(74) *Attorney, Agent, or Firm*—Sonnenschein Nath & Rosenthal LLP

(57) ABSTRACT

A sound signal encoder for high efficiency encoding of sound signals from a plurality of channels is provided which includes a to-be-correlated object setter (52), to-be-correlated object selector (56) and a variable-length encoder (58). The to-be-correlated object setter (52) sets, on the basis of left-channel frequency information held in a left-channel frequency information holder (50) and right-channel frequency information held in a right-channel frequency information holder (51), index [i] indicating which ones of sine waves on the left channel are to be correlated with, namely, are to be subtracted from, sine waves on the right channel. The to-be-correlated object selector (56) selects a default value read from a storage unit (55) or index [i]-th amplitude information read from a left-channel amplitude information holder (53) as an object to be subtracted from the i-th amplitude information on the right channel according to the index [i]. The variable-length encoder (58) makes variable-length encoding of a difference resulted from subtraction of the left-channel amplitude information or default value as the to-be-correlated object from the amplitude information on the right channel.

17 Claims, 19 Drawing Sheets

FOREIGN PATENT DOCUMENTS

| | | |
|---|---|---|
| EP | 0 878 798 | 11/1998 |
| JP | 63-201700 | 8/1988 |
| JP | 07-283738 | 10/1995 |
| JP | 2002-49380 | 2/2002 |
| JP | 2002-311994 | 10/2002 |
| JP | 2003-44096 | 2/2003 |
| JP | 2003-108192 | 4/2003 |

* cited by examiner

| | LCH | | | RCH | | |
|---|---|---|---|---|---|---|
| n | FREQUENCY INFORMATION | AMPLITUDE INFORMATION | PHASE INFORMATION | FREQUENCY INFORMATION | AMPLITUDE INFORMATION | PHASE INFORMATION |
| 0 | 10 | 5 | 2 | 10 | 4 | 2 |
| 1 | 20 | 7 | 6 | 19 | 7 | 5 |
| 2 | 25 | 4 | 7 | 26 | 4 | 7 |
| 3 | 30 | 2 | 0 | 30 | 2 | 0 |

| n | DIFFERENCE (RCH - LCH) | BITS |
|---|---|---|
| 0 | −1 | 2 |
| 1 | 0 | 1 |
| 2 | 0 | 1 |
| 3 | 0 | 1 |
| TOTAL | | 5 |

FIG.3

| DIFFERENCE | VARIABLE-LENGTH CODE (BINARY) | BITS |
|---|---|---|
| −7 | 1 1 1 1 1 1 1 0 1 1 | 1 0 |
| −6 | 1 1 1 1 1 1 1 0 1 0 | 1 0 |
| −5 | 1 1 1 1 1 1 1 0 0 1 | 1 0 |
| −4 | 1 1 1 1 1 1 1 0 0 0 | 1 0 |
| −3 | 1 1 1 1 1 0 | 6 |
| −2 | 1 1 1 0 | 4 |
| −1 | 1 0 | 2 |
| 0 | 0 | 1 |
| +1 | 1 1 0 | 3 |
| +2 | 1 1 1 1 0 | 5 |
| +3 | 1 1 1 1 1 1 0 | 7 |
| +4 | 1 1 1 1 1 1 1 1 0 0 | 1 0 |
| +5 | 1 1 1 1 1 1 1 1 0 1 | 1 0 |
| +6 | 1 1 1 1 1 1 1 1 1 0 | 1 0 |
| +7 | 1 1 1 1 1 1 1 1 1 1 | 1 0 |

FIG.4

| n | DIFFERENCE(RCH-LCH) | BITS |
|---|---|---|
| 0 | 0 | 1 |
| 1 | −1 | 2 |
| 2 | 0 | 1 |
| 3 | 0 | 1 |
| TOTAL | | 5 |

FIG.5

| | LCH | | | RCH | | |
|---|---|---|---|---|---|---|
| n | FREQUENCY INFORMATION | AMPLITUDE INFORMATION | PHASE INFORMATION | FREQUENCY INFORMATION | AMPLITUDE INFORMATION | PHASE INFORMATION |
| 0 | 10 | 5 | 2 | 19 | 7 | 6 |
| 1 | 20 | 7 | 6 | 26 | 4 | 7 |
| 2 | 25 | 4 | 7 | 30 | 3 | 2 |
| 3 | 40 | 2 | 0 | 40 | 2 | 0 |

FIG.6

| n | DIFFERENCE (RCH - LCH) | BITS |
|---|---|---|
| 0 | +2 | 5 |
| 1 | −3 | 6 |
| 2 | −1 | 2 |
| 3 | 0 | 1 |
| TOTAL | | 14 |

FIG. 7

| n | DIFFERENCE (RCH - LCH) | BITS |
|---|---|---|
| 0 | +4 | 10 |
| 1 | +1 | 3 |
| 2 | −5 | 10 |
| 3 | 0 | 1 |
| TOTAL | | 24 |

FIG. 8

| n | TO-BE-CORRELATED OBJECT | DIFFERENCE (RCH - LCH) | BITS |
|---|---|---|---|
| 0 | n=0 | -1 | 2 |
| 1 | n=1 | 0 | 1 |
| 2 | n=2 | 0 | 1 |
| 3 | n=3 | 0 | 1 |
| TOTAL | | | 5 |

FIG.13

| n | TO-BE-CORRELATED OBJECT | DIFFERENCE (RCH - LCH) | BITS |
|---|---|---|---|
| 0 | n=0 | 0 | 1 |
| 1 | n=1 | -1 | 2 |
| 2 | n=2 | 0 | 1 |
| 3 | n=3 | 0 | 1 |
| TOTAL | | | 5 |

FIG.14

| n | TO-BE-CORRELATED OBJECT | DIFFERENCE (RCH - LCH) | BITS |
|---|---|---|---|
| 0 | n=1 | 0 | 1 |
| 1 | n=2 | 0 | 1 |
| 2 | DEFAULT VALUE | -1 | 2 |
| 3 | n=3 | 0 | 1 |
| TOTAL | | | 5 |

FIG.15

| n | TO-BE-CORRELATED OBJECT | DIFFERENCE (RCH - LCH) | BITS |
|---|---|---|---|
| 0 | n=1 | 0 | 1 |
| 1 | n=2 | 0 | 1 |
| 2 | DEFAULT VALUE | -2 | 4 |
| 3 | n=3 | 0 | 1 |
| TOTAL | | | 7 |

FIG.16

| | LCH | | | RCH | | |
|---|---|---|---|---|---|---|
| n | FREQUENCY INFORMATION | AMPLITUDE INFORMATION | PHASE INFORMATION | FREQUENCY INFORMATION | AMPLITUDE INFORMATION | PHASE INFORMATION |
| 0 | 10 | 5 | 2 | 20 | 7 | 6 |
| 1 | 20 | 7 | 6 | 25 | 4 | 7 |
| 2 | 25 | 4 | 7 | 40 | 2 | 0 |
| 3 | 40 | 2 | 0 | — | — | — |

FIG.19

| n | DIFFERENCE (RCH - LCH) | RCH=LCH? |
|---|---|---|
| 0 | +2 | FALSE |
| 1 | −3 | FALSE |
| 2 | −2 | FALSE |
| | | FALSE |

FIG.20

| n | TO-BE -CORRELATED OBJECT | DIFFERENCE (RCH - LCH) | RCH=LCH? |
|---|---|---|---|
| 0 | n=1 | 0 | TRUE |
| 1 | n=2 | 0 | TRUE |
| 2 | n=3 | 0 | TRUE |
| | | | TRUE |

FIG.21

| | LCH | | RCH | |
|---|---|---|---|---|
| n | GAIN CONTROL POSITION INFORMATION | GAIN CONTROL AMOUNT INFORMATION | GAIN CONTROL POSITION INFORMATION | GAIN CONTROL AMOUNT INFORMATION |
| 0 | 5 | 5 | 5 | 5 |
| 1 | 10 | 7 | 12 | 8 |
| 2 | 12 | 8 | 19 | 5 |
| 3 | 20 | 4 | 20 | 4 |

FIG.24

| n | DIFFERENCE (RCH - LCH) | BITS |
|---|---|---|
| 0 | 0 | 1 |
| 1 | +3 | 3 |
| 2 | −3 | 5 |
| 3 | 0 | 1 |
| TOTAL | | 10 |

FIG.25

| DIFFERENCE | VARIABLE-LENGTH CODE (BINARY) | BITS |
|---|---|---|
| −3 | 1 1 1 1 0 | 5 |
| −2 | 1 1 0 | 3 |
| −1 | 1 0 1 | 3 |
| 0 | 0 | 1 |
| 1 | 1 0 0 | 3 |
| 2 | 1 1 1 0 | 4 |
| o t h e r | 11111 + ORIGINAL (4 BITS) | 9 |

FIG.26

| n | TO-BE-CORRELATED OBJECT | DIFFERENCE (RCH - LCH) | BITS |
|---|---|---|---|
| 0 | n = 0 | 0 | 1 |
| 1 | n = 1 | 0 | 1 |
| 2 | n = 3 | + 1 | 3 |
| 3 | n = 3 | 0 | 1 |
| TOTAL | | | 6 |

FIG.27

| | LCH | | RCH | |
|---|---|---|---|---|
| n | GAIN CONTROL POSITION INFORMATION | GAIN CONTROL AMOUNT INFORMATION | GAIN CONTROL POSITION INFORMATION | GAIN CONTROL AMOUNT INFORMATION |
| 0 | 5 | 5 | 10 | 7 |
| 1 | 10 | 7 | 12 | 8 |
| 2 | 12 | 8 | 20 | 4 |
| 3 | 20 | 4 | — | — |

FIG.29

| n | DIFFERENCE (RCH - LCH) | RCH=LCH? |
|---|---|---|
| 0 | +2 | FALSE |
| 1 | +1 | FALSE |
| 2 | −4 | FALSE |
| | | FALSE |

FIG.30

| n | TO-BE -CORRELATED OBJECT | DIFFERENCE (RCH - LCH) | RCH=LCH? |
|---|---|---|---|
| 0 | n=1 | 0 | TRUE |
| 1 | n=2 | 0 | TRUE |
| 2 | n=3 | 0 | TRUE |
| | | | TRUE |

FIG.31

METHODS, STORAGE MEDIUM, AND APPARATUS FOR ENCODING AND DECODING SOUND SIGNALS FROM MULTIPLE CHANNELS

RELATED APPLICATION DATA

This application is a divisional of U.S. patent application Ser. No. 10/484,230, filed Jan. 16, 2004, the entirety of which is incorporated herein by reference to the extent permitted by law. Application Ser. No. 10/484,230 is the Section 371 National Stage of PCT/JP03/05909. The present application claims priority to Japanese Patent Application No. 2002-145267 filed in the Japanese Patent Office on May 20, 2002, the entirety of which also is incorporated by reference herein to the extent permitted by law.

BACKGROUND OF THE INVENTION

The present invention generally relates to a sound signal encoding method and apparatus, sound signal decoding method and apparatus, program, and a recording medium, and more particularly to a sound signal encoding method and apparatus for making high-efficiency coding of sound signals from a plurality of channels and transmitting the encoded sound signals or recording the signals to a recording medium, a recording medium having recorded therein a string of codes generated by the coding, a sound signal decoding method and apparatus for decoding the string of codes received or reproduced, a program for causing a computer to execute the sound signal coding or decoding process, and a computer-readable recording medium having the program recorded therein.

Conventionally, the unblocked frequency subband techniques represented by the subband coding or the like and the blocked frequency subband techniques represented by the transform coding or the like are known for making high-efficiency coding of audio signals such as sounds.

With the unblocked frequency subband techniques, a time-based audio is encoded by dividing it into a plurality of frequency subbands without blocking it. On the other hand, with the blocked frequency subband coding techniques, a time-based audio signal is divided into a plurality of frequency subbands by making frequency spectrum transform of the signal into a frequency-based signal, namely, coefficients obtained through the frequency spectrum transform of the audio signal are grouped by each of predetermined frequency subbands, and then the signal is encoded by the frequency subbands.

For an improved efficiency of coding, there has also been proposed a high-efficiency encoding technique being a combination of the unblocked frequency subband coding and blocked frequency subband coding. With this technique, a frequency band of a signal is divided by the subband coding into frequency subbands, for example, then the signal of each frequency subband is spectrally transformed into a frequency-based signal, and the signal is encoded by the spectrally transformed frequency subbands.

For dividing a frequency band, the quadrature mirror filter (QMF), for example, is used frequently since it can easily divide the frequency band with cancellation of aliasing. It should be noted that the frequency band division by the QMF is described in detail in the document “1976 R. E. Crochiere, Digital Coding of Speech in Subbands, Bell Syst. Tech. J. Vol. 55, No. 8, 1976” and the like.

The frequency subband techniques further include the polyphase quadrature filter (PQF), for example. This technique is to divide a frequency band into equal bandwidths.

The PQF technique is detailed in the document “ICASSP 83 BOSTON, Polyphase Quadrature Filters—A new subband coding technique, Joseph H. Rothweiler” and the like.

On the other hand, the aforementioned frequency spectrum transform techniques includes a one by which an input audio signal is blocked into frames of a predetermined unit time, and a time-based signal is transformed into a frequency-based signal by subjecting each block to discrete Fourier transform (DFT), discrete cosine transform (DCT), modified discrete cosine transform (MDCT) or the like.

Note that the MDCT is described in detail in the document “ICASSP, 1987, Subband/Transform Coding Using Filter Bank Designs Based on Time Domain Aliasing Cancellation, J. P. Princen, A. B. Bradley, Univ. of Surrey Royal Melbourne Inst. of Tech.” and the like.

By quantizing the signal of each frequency band, produced using the filter or spectrum transform as above, it is possible to control a frequency band caused by a quantization noise, whereby the signal can be encoded with an acoustically higher efficiency with the use of the masking effect of the noise. Also, the signal can be encoded with a much higher efficiency by normalizing signal components of each frequency subband with a largest absolute value of the signal components of the subband, for example.

The width of each frequency subband is determined with the human auditory sense, for example. Generally, an audio signal is divided into a plurality of frequency subbands (32 subbands, for example) called “critical band” of which the width is larger as the frequency is higher.

Also, to encode data of each frequency subband, a predetermined bit allocation or an adaptive bit allocation is made to the frequency subband. That is to say, to encode coefficient data obtained through the MDCT by a bit allocation, a number of bits are adaptively allocated to MDCT coefficient data of each frequency subband, obtained through the MDCT of each block of signal.

For configuration of an actual code string, first quantization accuracy information indicating a quantization step and a normalization coefficient indicating a coefficient used to normalize each signal component are encoded with a predetermined number of bits for each frequency subband to be normalized and quantized, and then the normalized and quantized spectrum signal is encoded.

For a further improvement of the compression ratio from a value, main information to directly be encoded, for example, it is necessary to improve the efficiency of encoding the spectrum signal as well as the efficiency of encoding sub-information which is not encoded directly such as the quantization accuracy information, normalization coefficient and the like.

On this account, the Inventors of the present invention have proposed, by the specification and drawings included in the Japanese patent application No. 2000-390589 already fined, a technique of improving the efficiency of encoding such sub-information with a variable-length coding using an inter-channel correlation between audio signals or a coding by controlling the range of existential distribution using the gradient coefficient.

Also, the Inventors of the present invention have proposed, by the specification and drawings included in the Japanese Patent Application No. 2001-182093, a technique of improving the efficiency of encoding gain information by the use of various kinds of correlation in a coding in which a gain control is made to suppress quantization noises called “pre-echo/post-echo”, caused by the quantization of the spectrum signal.

Furthermore, the Inventors of the present invention has proposed, by the specification and drawings included in the Japanese Patent Application Nos. 2000-380639 and 2001-182384, a technique of improving the efficiency of coding by a extracting tone component from a time-series signal and making spectrum transform coding of a residual error to prevent the efficiency of coding from being deteriorated by the tone component existent in a local frequency such as a sine wave, which was observed in the conventional coding techniques.

Note that the sine wave information indicating the extracted tone component, for example, waveform parameters such as frequency information, amplitude information, phase information, are encoded separately from the spectrum information, normalization information and quantization accuracy information of the residual error signal.

The ratio of compression can be increased by encoding the residual error signal with the technique disclosed in the specification and drawings included in the Inventors' Japanese patent application No. 2000-390589 or 2001-182093, for example the variable-length coding using an inter-channel correlation between audio signals or the coding by controlling the range of existential distribution using the gradient coefficient.

Different from the spectrum information, normalization information or quantum accuracy information of the residual error signal, however, the extracted tone component exists evenly in all the frequency bands, so that the coding efficiency will be worse in the variable-length coding using an inter-channel correlation between audio signals as the case may be.

The conventional variable-length coding using the inter-channel correlation between audio signals will be described in detail below. In the following description, it is assumed that the number of channels is two (2), namely, the audio signals are stereo signals, and the inter-channel correlation means a correlation between right and left channels. Also, although there will be described an example in which the correlation between the right and left channels is used for only amplitude information of the sine wave information indicating a tone component, the description is also true for phase information. Further, it is assumed that there have been extracted a number $N_L$ of sine waves on the left channel Lch and a number of $N_R$ sine waves on the right channel Rch.

FIG. 1 shows the general construction of a portion of a conventional sine wave information encoder which encodes sine wave information with the use of a correlation between the right and left channels, that encodes amplitude information on the right channel Rch. For the simplicity of illustration and explanation, however, it is assumed here that the number $N_L$ of sine waves on the left channel Lch is equal to the number $N_R$ of sine waves on the right channel Rch. As shown in FIG. 1, the sine wave information encoder, generally indicated with a reference number 200, includes a left-channel amplitude information holder 201, right-channel amplitude information holder 202, adder-subtracter 203, variable-length encoder 204 and a code string generator 205.

The left-channel amplitude information holder 201 indexes a number $N_L$ of sine waves extracted from the left channel Lch by 0 to $N_L-1$, respectively, sequentially starting with the lowest-frequency one, and holds amplitude information in correspondence to the indexes. Similarly, the right-channel amplitude information holder 202 indexes a number $N_R$ of sine waves extracted from the right channel Rch by 0 to $N_R-1$, respectively, sequentially starting with the lowest-frequency one, and holds amplitude information in correspondence to the indexes. Then, the left- and right-channel amplitude information holders 201 and 202 supply the amplitude information held therein to the adder-subtracter 203.

The adder-subtracter 203 calculates a difference by subtracting the i-th amplitude information on the left channel Lch from the i-th amplitude information on the right channel Rch, and supplies the difference thus calculated to the variable-length encoder 204.

The variable-length encoder 204 makes variable-length coding of the difference supplied from the adder-subtracter 203 according to a variable-length code table to provide a variable-length code, and supplies the variable-length code as a sine wave information code to the code string generator 205.

The code string generator 205 generates a code string according to the sine wave information code supplied from the variable-length encoder 204.

When supplied with sine wave information as shown in FIG. 2, the sine wave information encoder 1 works as will be described below. As will be known, many of the information on the right channel are similar in value to corresponding ones on the left channel, and so the correlation between the right and left channels can be utilized to encode the information with an improved efficiency. In encoding amplitude information (3 bits when not compressed), the difference resulted from subtraction of amplitude information on the left channel Lch from one on the right channel Rch, corresponding in index (n) to the amplitude information on the left channel Lch, will be as shown in FIG. 3. Since the difference distribution is not even, the number of bits encoded can be reduced by making variable-length coding according to a variable-length code table as shown in FIG. 4 for example. More specifically, the amplitude information on the right channel Rch can be encoded with a total of 5 bits. Namely, the phase information (of 12 bits (=3 bits×4) when not compressed) can be compressed by 7 bits.

Similarly, in encoding phase information (of 3 bits when not compressed), the difference resulted from subtraction of phase information on the left channel from that on the right channel Rch, corresponding in index (n) to the amplitude information on the left channel Lch, will be as shown in FIG. 5. By making variable-length coding of the difference according to the variable-length code table shown in FIG. 4, the phase information on the right channel Rch can be encoded with a total of 5 bits. This number of bits is 7 bits smaller than 12 bits (=3 bits×4) when the phase information is not compressed.

When supplied with sine wave information as shown in FIG. 6, the sine wave information encoder 1 works as will be described below. As will be known, many of information on the right channel are similar in value to corresponding ones on the left channel. Since a difference is calculated between the amplitude information on the right channel Rch and that on the left channel Lch, corresponding in index (n) to the amplitude information on the right channel Rch, the difference is a total of 14 bits as shown in FIG. 7. The amplitude information is of 12 bits when not compressed. Similarly, the difference in phase information between the right and left channels Rch and Lch is a total of 24 bits as shown in FIG. 8, which means a lower efficiency of coding than when the phase information is not compressed.

SUMMARY OF THE INVENTION

Accordingly, the present invention has an object to overcome the above-mentioned drawbacks of the conventional techniques for high-efficiency coding of audio signals such as sounds or the like by providing a novel sound signal encoding method and apparatus, a recording medium having recorded therein a code string generated by the sound signal encoding method and apparatus, a sound signal decoding method and apparatus for receiving or reproducing and decoding the code string, a program for allowing a computer to perform the sound signal encoding or sound signal decoding, and a computer-readable recording medium having the program recorded therein.

Another object of the present invention is to provide a sound signal encoding method and apparatus, capable of encoding sound signals with an improved efficiency with a variable-length encoding technique using an inter-channel correlation between the sound signals, a recording medium having recorded therein a code string generated by the sound signal encoding method and apparatus, a sound signal decoding method and apparatus for receiving or reproducing and decoding the code string, a program for allowing a computer to perform the sound signal encoding or sound signal decoding, and a computer-readable recording medium having the program recorded therein.

The above object can be attained by providing a sound signal encoding method and apparatus, in which in encoding sound signals from a plurality of channels, an arbitrary number of sine waves are extracted from each of the sound signals from the plurality of channels, first-channel information including sine wave information standing on a sine wave extracted from a first one of the plurality of channels and second-channel information including sine wave information standing on a sine wave extracted from a second one of the plurality of channels or sine wave information standing on a predetermined sine wave are used to set one of the sine wave information in the second-channel information or the sine wave information standing on the predetermined sine wave as a to-be-correlated object for encoding in correlation with each sine wave information in the first-channel information, and the sine wave information in the second-channel information is encoded and the sine wave information in the first-channel information is encoded using the correlation with the sine wave information set as the to-be-correlated object.

Also the above object can be attained by providing a sound signal encoding method and apparatus in which in encoding sine wave information from a first channel, one of sine wave information from a second channel or predetermined sine wave information is set as a to-be-correlated object in correlation with the first-channel sine wave information, and the first-channel sine wave information is encoded using the correlation with the sine wave information as the to-be-correlated object.

Also the above object can be attained by providing a sound signal decoding method and apparatus in which in restoring sound signals from a plurality of channels by decoding a sine wave information code obtained by extracting an arbitrary number of sine waves from each of the sound signals from the plurality of channels, using first-channel information including sine wave information standing on a sine wave extracted from a first one of the plurality of channels and second-channel information including sine wave information standing on a sine wave extracted from a second one of the plurality of channels or sine wave information standing on a predetermined sine wave to set one of the sine wave information in the second-channel information or the sine wave information standing on the predetermined sine wave as a to-be-correlated object for encoding in correlation with each sine wave information in the first-channel information, encoding the sine wave information in the second-channel information and encoding the sine wave information in the first-channel information using the correlation with the sine wave information set as the to-be-correlated object, the sine wave information in the encoded second-channel information is decoded, the sine wave information in the encoded first-channel information is decoded using the correlation with the sine wave information set as the to-be-correlated object, and the sound signals from the plurality of channels are restored on the basis of the sine wave information in the first-channel information and sine wave information in the second-channel information.

In the above sound signal decoding method and apparatus, in decoding the encoded first-channel sine wave information using the correlation with one of the second-channel sine wave information or predetermined sine wave information, the encoded second-channel sine wave information is decoded and then the encoded first-channel sine wave information is decoded using the correlation with the sine wave information set as the to-be-correlated object.

Also the above object can be attained by providing a sound signal encoding method and apparatus in which in encoding sound signals from a plurality of channels, an arbitrary number of gain control information are generated correspondingly to the amplitude of the sound signals from the plurality of channels for gain control of the sound signals, the gain control information generated for the first-channel sound signal and gain control information generated for the second-channel sound signal are used to set one of the second-channel gain control information or predetermined gain control information as an to-be-correlated object for encoding in correlation with each first-channel gain control information, the second-channel gain control information is encoded, and the first-channel gain control information is encoded using the correlation with the gain control information set as the to-be-correlated object.

In the above sound signal encoding method and apparatus, in encoding the first-channel gain control information, one of the second-channel gain control information or predetermined gain control information is set as the to-be-correlated object in correlation with the first-channel gain control information, and the first-channel gain control information is encoded using the correlation with the gain control information as the to-be-correlated object.

Also the above object can be attained by providing a sound signal decoding method and apparatus in which in restoring sound signals from a plurality of channels by decoding a gain control information code obtained by generating an arbitrary number of gain control information correspondingly to the amplitude of the sound signals from the plurality of channels for gain control of the sound signals, using the gain control information generated for the first-channel sound signal and gain control information generated for the second-channel sound signal to set one of the second-channel gain control information or predetermined gain control information as an to-be-correlated object for encoding in correlation with each first-channel gain control information, encoding the second-channel gain control information, and encoding the first-channel gain control information using the correlation with the gain control information set as the to-be-correlated object, the encoded second-channel gain control information is decoded, the encoded first-channel gain control information is decoded using the correlation with the gain control information set as the to-be-correlated object, and gain control correction is made on the basis of the first-channel information and second-channel gain control information.

In the above sound signal decoding method and apparatus, in decoding the encoded first-channel gain control information using the correlation with one of the second-channel gain control information or predetermined gain control information, the encoded second-channel gain control information is decoded and then the encoded first-channel gain control information is decoded using the correlation with the gain control information set as the to-be-correlated object.

Also the above object can be attained by providing a program allowing a computer to execute the above sound signal encoding or decoding. Also the above object can be attained by providing a computer-readable recording medium having the program recorded therein.

Also the above object can be attained by providing a recording medium having a sine wave information code or gain control information code obtained through the sound signal encoding.

These objects and other objects, features and advantages of the present invention will become more apparent from the following detailed description of the best mode for carrying out the present invention when taken in conjunction with the accompanying drawings.

BRIEF DESCRIPTION OF THE DRAWINGS

FIG. 3 shows, by way of example, differences in amplitude information between the right and left channels Rch and Lch, the information corresponding in index to each other, and corresponding numbers of encoded bits.

FIG. 4 shows, by way of example, differences in phase information between the right and left channels Rch and Lch, the information corresponding in index to each other, and corresponding numbers of encoded bits.

FIG. 5 shows an example of the variable-length code table used for encoding amplitude or phase information.

FIG. 6 shows another example of the sine wave information on the right and left channels.

FIG. 7 shows, by way of another example, differences in amplitude information between the right and left channels Rch and Lch, the information corresponding in index to each other, and corresponding numbers of encoded bits.

FIG. 8 shows, by way of another example, differences in phase information between the right and left channels Rch and Lch, the information corresponding in index to each other, and corresponding numbers of encoded bits.

FIG. 13 shows, by way of example, differences amplitude information on the right channel (Rch) and amplitude information on the left channel (Lch), to be correlated with the former, and corresponding numbers of encoded bits.

FIG. 14 shows, by way of example, differences between phase information on the right channel (Rch) and phase information on the left channel (Lch), to be correlated with the former, and corresponding numbers of encoded bits.

FIG. 15 shows, by way of another example, differences between amplitude information on the right channel (Rch) and amplitude information on the left channel (Lch), to be correlated with the former, and corresponding numbers of encoded bits.

FIG. 16 shows, by way of another example, differences between phase information on the right channel (Rch) and phase information on the left channel (Lch), to be correlated with the former, and corresponding numbers of encoded bits.

FIG. 19 shows an example of sine wave information on right and left channels.

FIG. 20 shows an example of non-coincidence, in the conventional method, of amplitude or phase information on the right channel Rch with amplitude or phase information on the left channel Lch.

FIG. 21 shows an example of coincidence, in the method according to the present invention, of amplitude or phase information on the right channel Rch with amplitude or phase information on the left channel Lch.

FIG. 24 shows an example of gain control information on right and left channels.

FIG. 25 shows, by way of example, differences between gain control information on the right channel (Rch) and gain control information on the left channel (Lch), to be correlated with the former, and corresponding numbers of encoded bits, in the conventional method.

FIG. 26 shows an example of the variable-length code table used for encoding gain control information.

FIG. 27 shows, by way of example, differences between gain control information on the right channel (Rch) and gain control information on the left channel (Lch), to be correlated with the former, and corresponding numbers of encoded bits, in the method according to the present invention.

FIG. 29 shows an example of gain control information on right and left channels.

FIG. 30 shows an example of non-coincidence, in the conventional method, of gain control information on the right channel Rch with gain control information on the left channel Lch.

FIG. 31 shows an example of coincidence, in the method according to the present invention, of gain control information on the right channel Rch with gain control information on the left channel Lch.

DETAILED DESCRIPTION OF THE PRESENTLY PREFERRED EMBODIMENTS

The present invention is embodied in the modes which will be described below with the accompanying drawings. The embodiments which will be described below are applications of the present invention to a sound signal encoding apparatus and method, capable of making variable-length coding sine wave information extracted from audio signals from a plurality of channels efficiently with the use of an inter-channel correlation, a recording medium having recorded therein a string of codes generated by the above variable-length encoding, and a sound signal decoding apparatus and method, capable of decoding the code string.

The following description will cover first the general construction of the sound signal encoder and decoder according to the present invention, and then the applications of the above sound signal encoder and decoder. It should be noted that in the following description, it is assumed that the number of channels are two (2), namely, the audio signals are stereo signals, but it is of course that the present invention is not limited to this number of channels.

Figure 9:
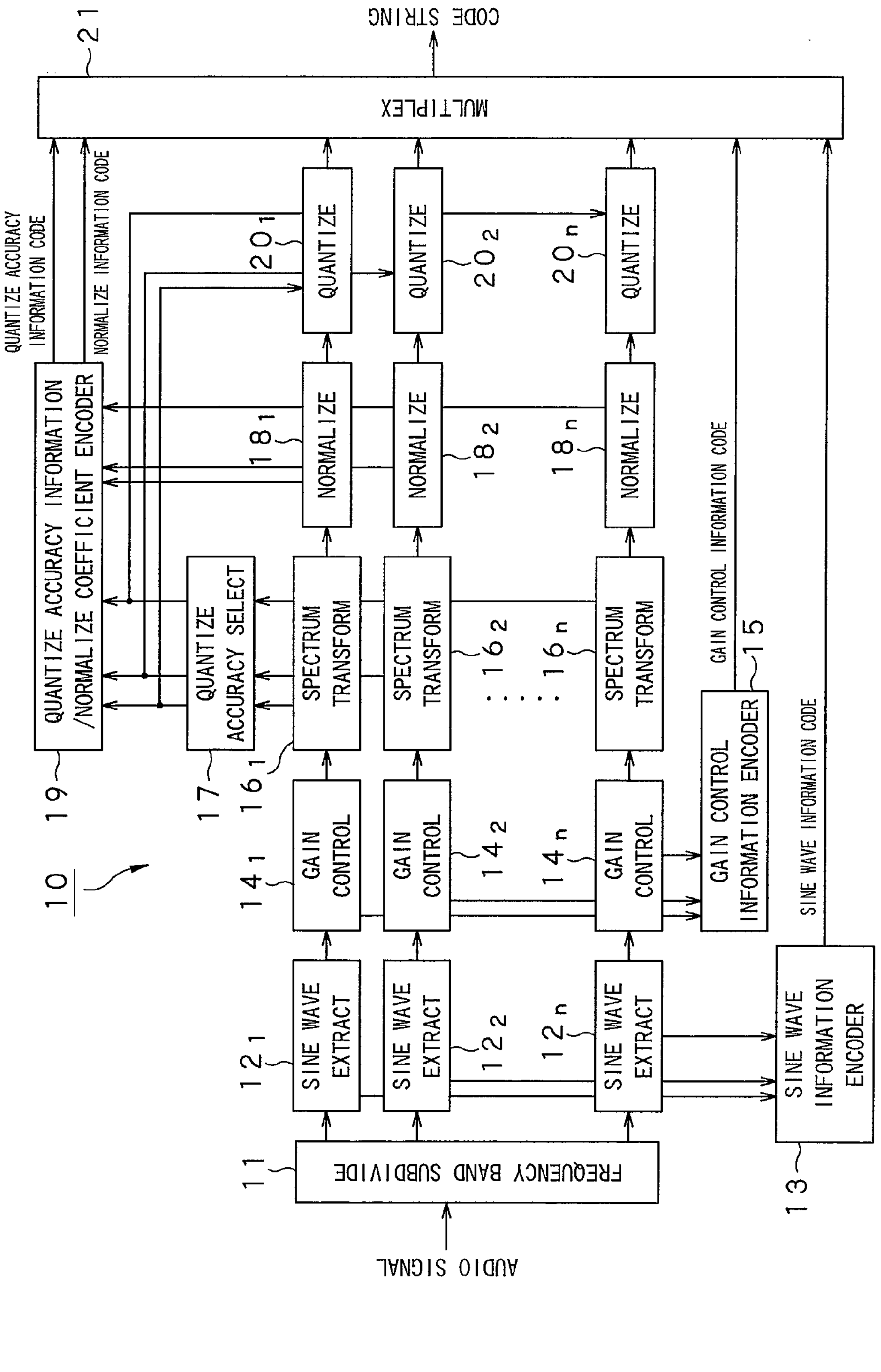
FIG. 9 schematically illustrates the sound signal encoder according to the present invention.

Referring now to FIG. 9, there is schematically illustrated in the form of a block diagram the sound signal encoder according to the present invention. The sound signal encoder is generally indicated with a reference number 10. As shown in FIG. 9, the sound signal encoder 10 includes a frequency band divider 11. The frequency band divider 11 is supplied with an audio signal to be encoded. Using a filter such as QMF (quadrature mirror filter) or PQF (polyphase quadrature filter), the frequency band divider 11 divides the audio signal into signals of n frequency subbands. It should be noted that the width of each of the subbands (will be referred to as "encoded unit" hereafter wherever appropriate) into which an audio signal is divided in frequency by the frequency band divider 11 may be either uniform or non-uniform correspondingly to a critical bandwidth. The frequency band divider 11 divides the audio signal into the n encoded units (will be referred to as "first to n-th encoded units" hereafter wherever appropriate), and supplies them to a sine wave extraction units $\mathbf{12}_1$ to $\mathbf{12}_n$ at every predetermined time block (frame).

The sine wave extraction units 12.sub.1 to 12.sub.n extract sine waves such as tone components from time-based signals in the first to n-th encoded units supplied from the frequency band divider 11. Note that for extraction of the sine wave such as tone component from the time-based signal, there may be used the Wiener-proposed Generalized Harmonic Analysis (GHA) disclosed in the specifications and drawings of the Japanese Patent Application Nos. 2000-380639 and 2001-182384 the Inventors already filed, for example. The "Generalized Harmonic Analysis (GHA) is such that a sine wave whose residual energy in an analyzed block is smallest is extracted from an original time-series signal and such an extraction is repeated with respect to the residual signal. Each of the sine wave extraction units 12.sub.1 to 12.sub.n supply waveform parameter of the extracted sine wave, such as frequency, amplitude information and phase information, to a sine wave information encoder 13.

The sine wave information encoder 13 encodes sine wave information such as frequency, amplitude information and phase information supplied from the sine wave extraction units $\mathbf{12}_1$ to $\mathbf{12}_n$. At this time, the sine wave information encoder 13 makes variable-length coding of the amplitude information and phase information using a correlation between the right and left channels efficiently. The sine wave information encoder 13 supplies the sine wave information code thus obtained to a multiplexer 21.

The sound signal encoder 10 also includes gain controllers $\mathbf{14}_1$ to $\mathbf{14}_n$. These gain controllers $\mathbf{14}_1$ to $\mathbf{14}_n$ generate gain control information according to the amplitudes of the residual signals in the analyzed blocks and control the gains of signals in the analysis blocks according to the gain control information. The gain controllers $\mathbf{14}_1$ to $\mathbf{14}_n$ supply the gain control information to a gain control information encoder 15, and signals in the first to n-th encoded units resulted from the gain control to spectrum transform units $\mathbf{16}_1$ to $\mathbf{16}_n$.

The gain control information encoder 15 encodes the gain control information supplied from the gain controllers $\mathbf{14}_1$ to $\mathbf{14}_n$. The gain control information encoder 15 supplies the gain control information code thus obtained to the multiplexer 21.

The spectrum transform units $\mathbf{16}_1$ to $\mathbf{16}_n$ make spectrum transform such as MDCT (modified discrete cosine transform) of the time-based signals supplied from the gain controllers $\mathbf{14}_1$ to $\mathbf{14}_n$ to generate frequency-based spectrum signals to quantization accuracy selection unit 17 and normalization units $\mathbf{18}_1$ to $\mathbf{18}_n$.

The quantization accuracy selection unit 17 selects a quantization step for quantizing to-be-normalized data of the first to n-th encoded units on the basis of the spectrum signals of the first to n-th encoded units supplied from the spectrum transform units $\mathbf{16}_1$ to $\mathbf{16}_n$. Then, the quantization accuracy selection unit 17 supplies the quantization accuracy information on the first to n-th encoded units corresponding to the selected quantization step to a quantization accuracy information/normalization coefficient encoder 19 and quantizers $\mathbf{20}_1$ to $\mathbf{20}_n$.

The normalization units $\mathbf{18}_1$ to $\mathbf{18}_n$ extract a one, whose absolute value is largest, of components of spectrum signals in the first to n-th encoded units, and take a coefficient corresponding to the maximum value as a normalization coefficient for the first to n-th encoded units. The normalization units $\mathbf{18}_1$ to $\mathbf{18}_n$ normalize (divide) the components of the spectrum signals in the first to n-th encoded units with (by) values corresponding to the normalization coefficients for the first to n-th encoded units. In this case, the to-be-normalized data obtained through the normalization ranges from −1.0 to 1.0. The normalization units $\mathbf{18}_1$ to $\mathbf{18}_n$ supply the normalization coefficients for the first to n-th encoded units to the quantization accuracy information/normalization coefficient encoder 19 and the to-be-normalized data on the first to n-th encoded units to the quantizers $\mathbf{20}_1$ to $\mathbf{20}_n$.

The quantization accuracy information/normalization coefficient encoder 19 encodes the quantization accuracy information supplied from the quantization accuracy selector 17 and normalization coefficients from the normalization units $\mathbf{18}_1$ to $\mathbf{18}_n$. For encoding the quantization accuracy information and normalization coefficients, there may be used the technique disclosed in the specification and drawings in the Japanese Patent Application No. 2000-390589 the Inventors filed already, for example. That is, the encoding can be done with an improved efficiency through the variable-length encoding using a correlation between adjacent encoded units, adjacent channels or adjacent times. The quantization accuracy information/normalization coefficient encoder 19 supplies the quantization accuracy information code and normalization information code thus obtained to the multiplexer 21.

The quantizers $\mathbf{20}_1$ to $\mathbf{20}_n$ encode the to-be-normalized data in the first to n-th encoded units at the quantization steps corresponding to the quantization accuracy information in the first to n-th encoded steps, and supply quantization coefficients thus obtained for the first to n-th encoded units to the multiplexer 21.

The multiplexer 21 multiplexes the quantization coefficients for the first to n-th encoded units with the gain control information code, quantization accuracy information code and normalization information code. The multiplexer 21 transmits or records a code string resulted from the multiplexing to a recording medium (not shown).

As above, the sound signal encoder 10 according to the present invention extracts sine waves such as tone components from the input audio signal and encode the waveform parameters such as frequency, amplitude information and phase information. At this time, variable-length coding is made of the amplitude information and phase information by the efficient use of the correlation between the right and left channels. Also, the encoder 10 encodes the residual signal resulted from extraction of sine waves from the audio signal after completion of the spectrum transform such as MDCT, for example.

Figure 10:
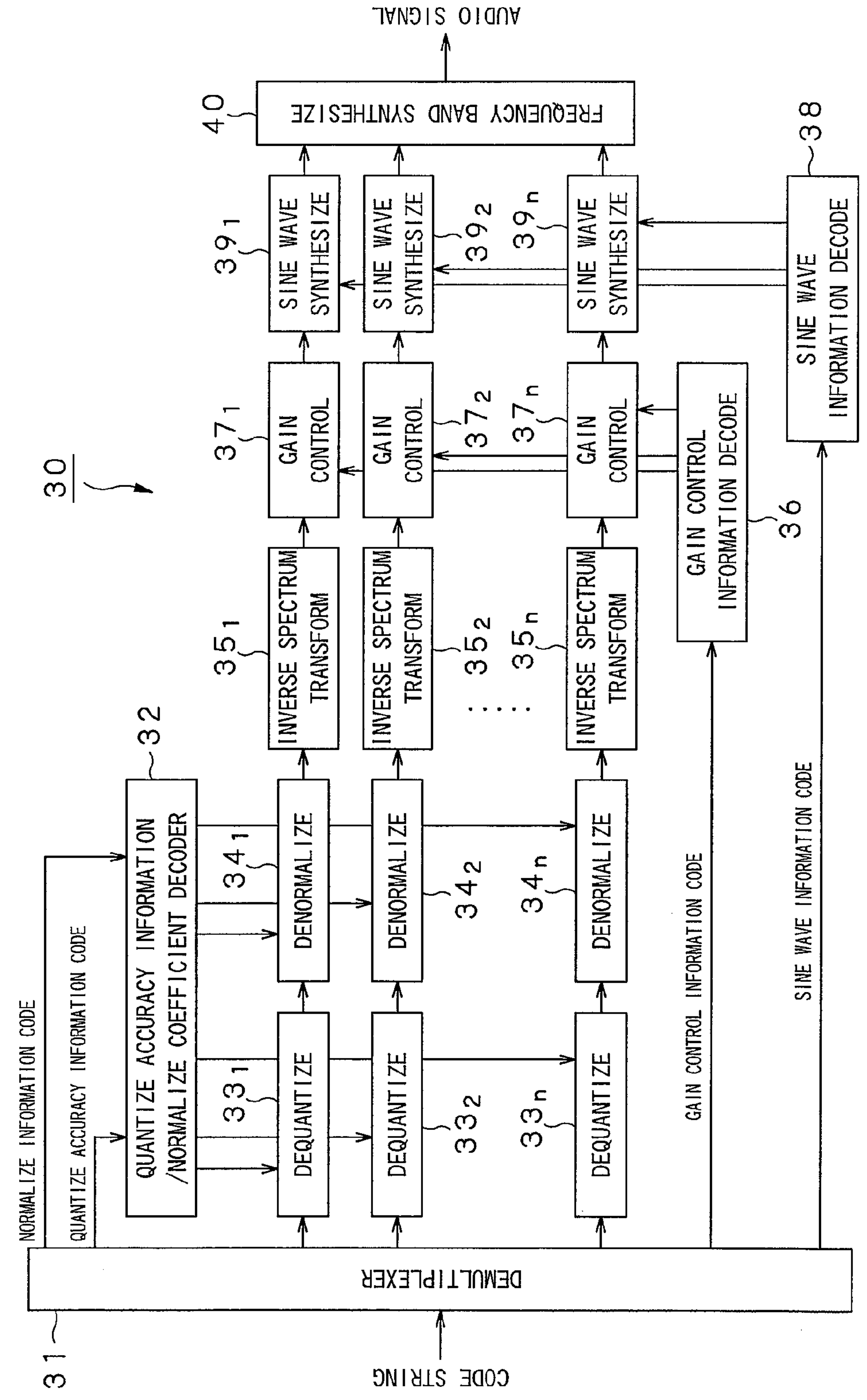
FIG. 10 schematically illustrates the sound signal decoder according to the present invention.

Referring now to FIG. 10, there is schematically illustrated in the form of a block diagram the sound signal decoder according to the present invention, generally indicated with a reference number 30. The sound signal decoder 30 is supplied with a code string transmitted from the sound signal encoder 10 or supplied from the sound signal encoder 10 via a recording medium.

As shown in FIG. 10, the sound signal decoder 30 includes a demultiplexer 31 which decodes the input code string into the quantization coefficients, quantization accuracy information code, normalization information code, gate control information code and sine wave information code in the first to n-th encoded units. The demultiplexer 31 supplies the quantization coefficients in the first to n-th encoded units to the dequantizers $\mathbf{33}_1$ to $\mathbf{33}_n$ corresponding to the encoded units, respectively, and the quantization accuracy information code and normalization information code in the first to n-th encoded units to a quantization accuracy information/normalization coefficient decoder 32. Also, the demultiplexer 31 supplies the gain control information code and sine wave information code to a gain control information decoder 36 and sine wave information decoder 38, respectively.

The quantization accuracy information/normalization coefficient decoder 32 decodes the supplied quantization accuracy information code and normalization information code and supplies the decoded quantization accuracy information and normalization coefficient to the dequantizer $\mathbf{33}_1$ to $\mathbf{33}_n$, and denormalization units $\mathbf{34}_1$ to $\mathbf{34}_n$, respectively.

The dequantizers $\mathbf{33}_1$ to $\mathbf{33}_n$ dequantize the quantization coefficients in the first to n-th encoded units at quantization steps corresponding to the quantization accuracy information in the encoded units to generate to-be-normalized data on the first to n-th encoded units. The dequantizers $\mathbf{33}_1$ to $\mathbf{33}_n$, supply the to-be-normalized data on the first to n-th encoded units to the denormalization units $\mathbf{34}_1$ to $\mathbf{34}_n$.

The denormalization units $\mathbf{34}_1$ to $\mathbf{34}_n$ decode the to-be-normalized data on the first to n-th encoded units supplied from the dequantizers $\mathbf{33}_1$ to $\mathbf{33}_n$ by multiplying the data by values corresponding to the normalization information in the first to n-th encoded units, respectively, to generate spectrum signals for the first to n-th encoded units. The denormalization units $\mathbf{34}_1$ to $\mathbf{34}_n$ supply the spectrum signals for the first to n-th encoded units to inverse spectrum transform units $\mathbf{35}_1$ to $\mathbf{35}_n$.

The inverse spectrum transform units $\mathbf{35}_1$ to $\mathbf{35}_n$ make inverse spectrum transform such as IMDCT (inverse MDCT) of the spectrum signals for the first to n-th encoded units supplied from the denormalization units $\mathbf{34}_1$ to $\mathbf{34}_n$ to generate a time-based signal and supply the time-based signal to gain controllers $\mathbf{37}_1$ to $\mathbf{37}_n$.

The gain control information decoder 36 which decodes the gain control information codes for the first to n-th encoded units and supplies the decoded gain control information to the gain controllers $\mathbf{37}_1$ to $\mathbf{37}_n$ corresponding to the respective encoded units.

The gain controllers $\mathbf{37}_1$ to $\mathbf{37}_n$ make gain control correction of the signals in the first to n-th encoded units on the basis of the gain control information supplied from the gain control information decoder 36, and supply the residual signals for the first to n-th encoded units to sine wave synthesizers $\mathbf{39}_1$ to $\mathbf{39}_n$.

The sine wave information decoder 38 decodes the sine wave information code, and supplies the decoded sine wave information, that is, frequency information, amplitude information and phase information to the sine wave synthesizers $\mathbf{39}_1$ to $\mathbf{39}_4$. At this time, the sine wave information decoder 38 makes variable-length decoding of the amplitude information and phase information with the efficient utilization of the correlation between the right and left channels.

The sine wave synthesizers $\mathbf{39}_1$ to $\mathbf{39}_4$ generate sine waves of the first to n-th encoded units on the basis of the sine wave information supplied from the sine wave information decoder 38, and combine the sine waves with the residual signals of the first to n-th encoded units supplied from the gain controllers $\mathbf{37}_1$ to $\mathbf{37}_n$ to generate signals of the first to n-th encoded units. The sine wave synthesizers $\mathbf{39}_1$ to $\mathbf{39}_4$ supply the signals of the first to n-th encoded units to a frequency band synthesizer 40.

The frequency band synthesizer 40 combines together the frequency bands of the signals of the first to n-th encoded units supplied from the sine wave synthesizers $\mathbf{39}_1$ to $\mathbf{39}_4$ to restore the original audio signal.

As above, the sound signal decoder 30 according to the present invention generates a sine wave on the basis of sine wave information such as frequency information, amplitude information and phase information included in an input code string. At this time, it makes variable-length decoding of the amplitude information and phase information with efficient utilization of a correlation between the right and left channels. The sound signal decoder 30 decodes quantization coefficient included in the input code string, and make inverse spectrum transform such as IMDCT, for example, of the quantization coefficient to generate a time-based signal. Then the sound signal decoder 30 combines the sine wave thus obtained with a residual signal to restore an original audio signal.

The aforementioned sine wave information encoder 13 can make higher-efficiency variable-length coding of waveform parameters such as amplitude information and phase information by utilizing the correlation between the right and left channels efficiently. So, the construction and operation of the sine wave information encoder 13 will be described in detail below. It should be noted that although the description of the construction and operation will be made concerning amplitude information, it is also quite true of phase information. Also, it is assumed in the following description that a number $N_L$ of sine waves have been extracted on the left channel Lch while a number $N_R$ of sine waves have been extracted on the right channel Rch.

Figure 11:
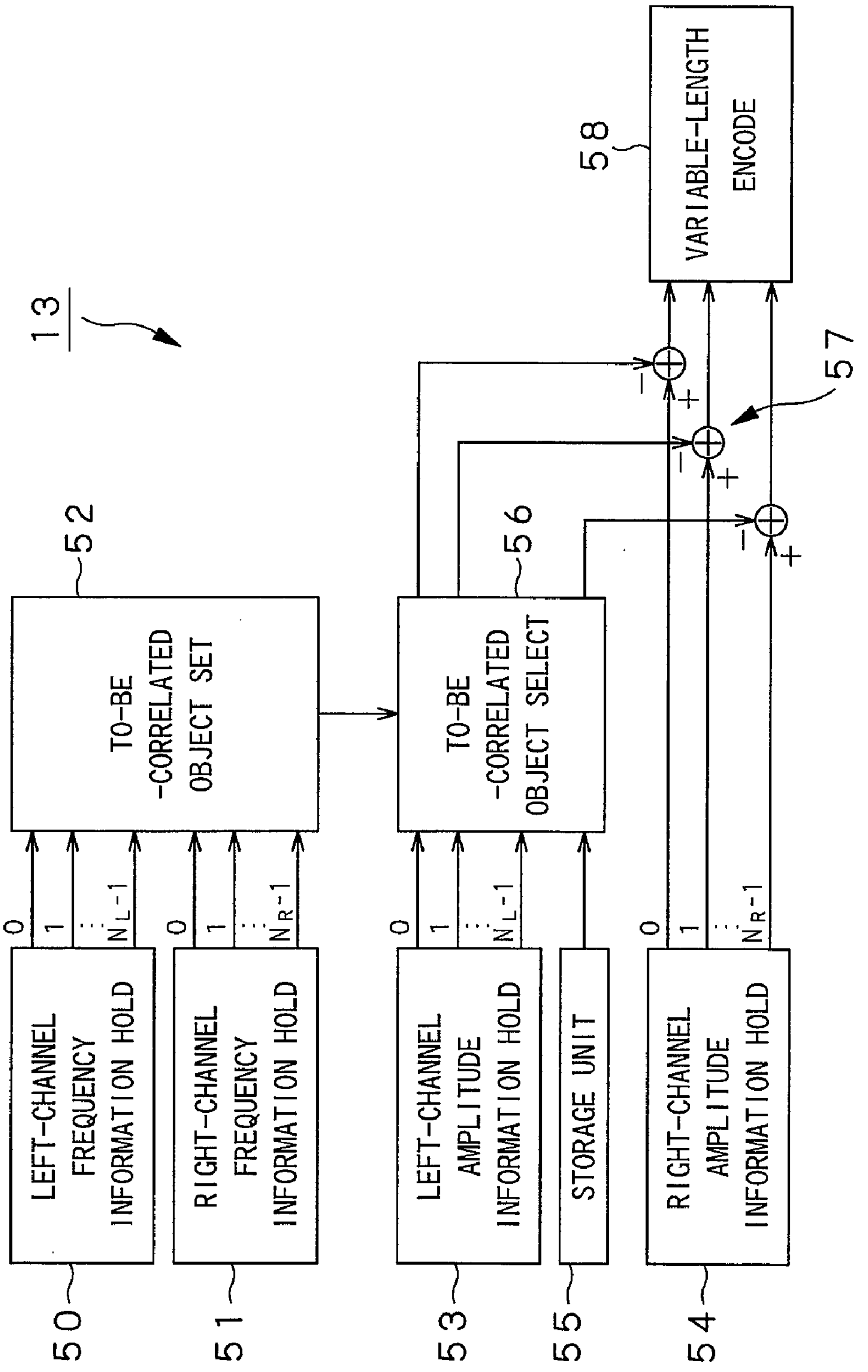
FIG. 11 schematically illustrates a portion of the sine wave information encoder included in the sound signal encoder according to the present invention, that encodes amplitude information on the right channel Rch.

A portion of the sine wave information encoder 13, that encodes amplitude information on the right channel Rch, is schematically illustrated in FIG. 11. As shown in FIG. 11, the sine wave information encoder 13 includes a left-channel frequency information holder 50, right-channel frequency information holder 51, to-be-correlated object setter 52, left-channel amplitude information holder 53, right-channel amplitude information holder 54, storage unit 55, to-be-correlated object selector 56, adder-subtracter 57, and a variable-length encoder 58.

The left-channel frequency information holder 50 indexes a number $N_L$ of sine waves extracted from the left channel Lch by 0 to $N_L-1$, respectively, sequentially starting with the lowest-frequency one, and holds the sine waves in correspondence to the indexes. Similarly, the right-channel amplitude information holder 51 indexes a number $N_R$ of sine waves extracted from the right channel Rch by 0 to $N_R-1$, respectively, sequentially starting with the lowest-frequency one, and holds the sine waves in correspondence to the indexes.

The to-be-correlated object setter 52 sets one of sine waves on the left-channel Lch, that is to be paired, namely, correlated, with a sine wave on the right channel Rch, from which the left-channel sine wave is to be subtracted, on the basis of the number $N_L$ of left-channel frequency information held in the left-channel frequency information holder 50 and the number $N_R$ of right-channel frequency information held in the right-channel frequency information holder 51. Namely, the setter 52 sets a sine wave on the left channel Lch, that is to be subtracted from with a sine wave on the right-channel Rch, to provide a difference (Rch−Lch).

Figure 12:
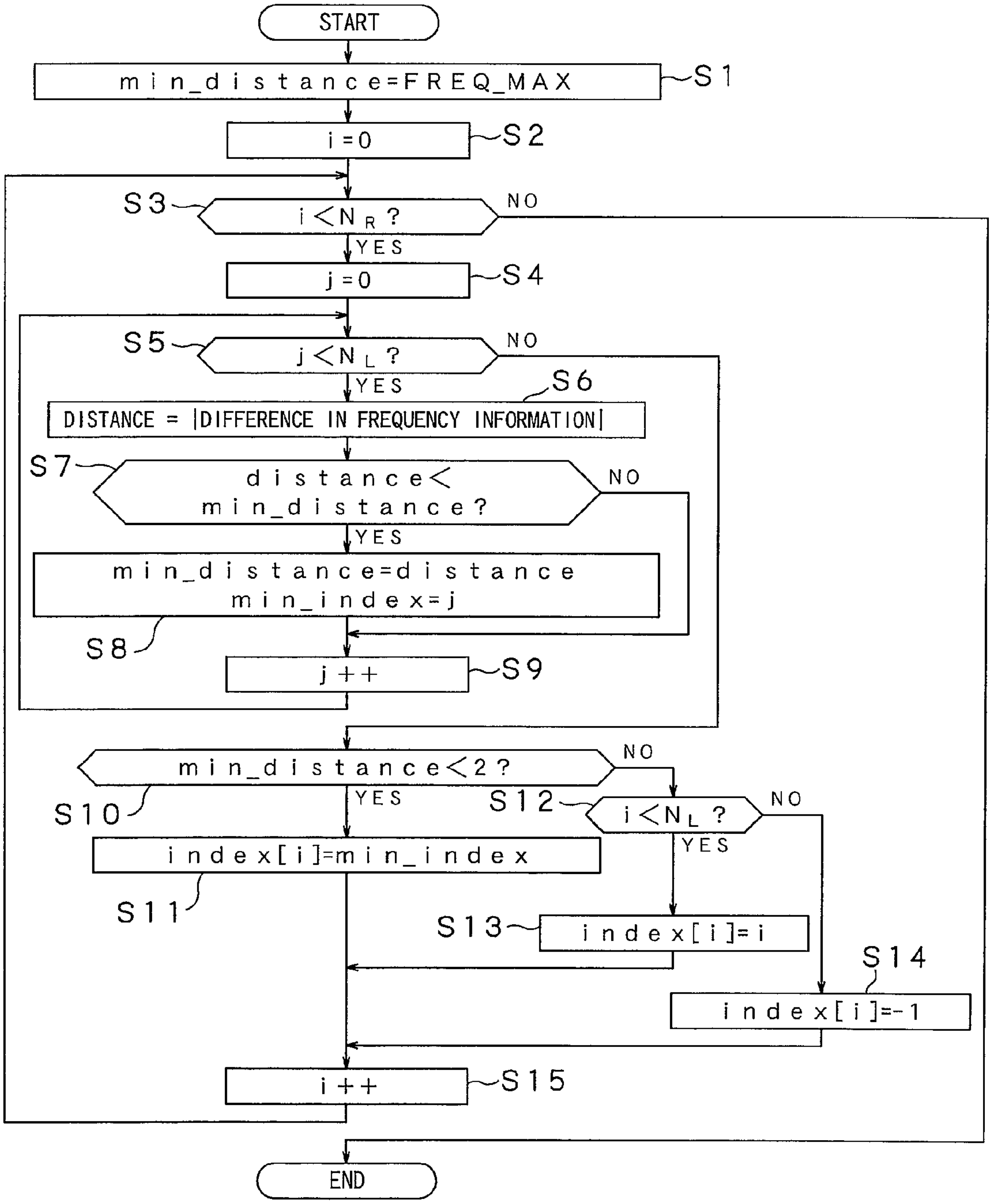
FIG. 12 shows a flow of operations made in setting a to-be-correlated object in the correlation setter in the sine wave information encoder.

The above setting of a to-be-correlated object will be described in detail below with reference to the flow chart in FIG. 12. First, in step S1, the setter 52 sets min distance to FREQ_MAX. The "FREQ_MAX" is a value exceeding a maximum value the frequency information can take, namely, a value exceeding an absolute value of a difference between two frequencies. For example, in case the frequency information freq is $0 \leqq freq < 128$, FREQ_MAX should be set to 128.

Next in step S2, the setter 52 sets an index i of 0. The "index i" indicates an index of the sine wave on the right channel Rch, and it is $0 \leqq i < N_R$.

Then in step S3, the setter 52 judges whether the index i is smaller than $N_R$. If the index i is smaller than $N_R$ (YES), the setter 52 goes to step S4. If the index i is not smaller than $N_R$ (NO), namely, when it is larger than $N_R$, the setter 52 exits the to-be-correlated object setting.

In step S4, the setter 52 sets an index j of 0. The "index j" is an index of the sine wave on the left channel Lch, and it is $0 \leqq j < N_L$.

In step S5, the setter 52 judges whether the index j is smaller than $N_L$. If the index j is smaller than $N_L$ (YES), the setter 52 goes to step S6. If the index j is not $N_L$ (NO), namely, if it is larger than $N_L$, the setter 52 goes to step S10.

Next in step S6, the setter 52 calculates an absolute difference between the i-th frequency information read from the right-channel frequency information holder 51 (see FIG. 11) and j-th frequency information read from the left-channel frequency information holder 50 (also see FIG. 11), and takes it as "distance".

In step S7, the setter 52 judges whether the "distance" is smaller than the min distance. If the "distance" is smaller than the min distance (YES), the setter 52 goes to step S8 where it will re-set the min distance and stores the index j at this time as a min_index. On the contrary, if the "distance" is larger than the min distance (NO), the setter 52 goes to step S9.

In step S9, the setter 52 increments the index j by one, and returns to step S5 where it will repeat operations similar to the above $N_L$ times until the index j becomes $N_L-1$. As a result, the min_index is of the frequency information on the left channel Lch, whose absolute difference from the i-th frequency information on the right channel Rch is smallest.

In step S10, the setter 52 judges whether the min_index is smaller than a predetermined threshold, that is, two (20, for example. If the index j is smaller than 2 (YES), namely, if it is 0 or 1, the setter 52 goes to step S11. On the contrary, if the index j is not smaller than 2 (NO), namely, if the min_index is larger than 2, the setter 52 goes to step S12. It should be noted that although the threshold is "2" in this example, this is just an example and an optimum value may be selected from a range of value the frequency information can taken.

In step S11, the setter 52 sets an index [i] of the min_index. The "index [i]" indicates an index of amplitude information on the left channel Lch, which is to be paired with the i-th amplitude information on the right channel Rch, namely, an object which is to be subtracted from the amplitude information on the right channel Rch is calculated in the encoding technique using an inter-channel difference.

In step S12, the setter 52 judges whether the index i is smaller than $N_L$. If it is determined in step S12 that the index i is smaller than $N_L$ (YES), it means that the left channel Lch has no sine wave information having any frequency near that of the i-th sine wave information on the right channel Rch. In this case, the setter 52 goes to step S13 where the setter 52 will set the index [i] to i, namely, an object which is to be subtracted from the i-th sine wave information on the right channel Rch, to the i-th sine wave information on the left channel Lch. On the contrary, if it is determined in step S12 that the index i is larger than $N_L$ (NO), it means that the left channel Lch has no object which is to be subtracted from the i-th sine wave on the right channel Rch. In this case, the setter 52 goes to step S14 where it will set the index [i] to a provisional value, for example, −1. It should be noted that in this case, a preset default value will be subtracted from the i-th sine wave on the right channel Rch.

In step S15, the setter 52 increments the index i by one, and then returns to step S3 where it will repeat operations similar to the above $N_R$ times until the index i becomes $N_R-1$.

All the indexes [i] are set to any of min_index, i and −1 as above. That is, the to-be-correlated object setter 52 sets a sine wave on the left channel Lch, whose frequency-based distance is smaller than the threshold, as an object to be subtracted from the sine wave on the right channel Rch. In case no sine wave smaller than the threshold exists on the left channel Lch, the setter 52 will set a sine wave having the same index on the left channel Lch as the object. If there are not on the left channel Lch any sine waves having the same index, for example, if the number of sine waves extracted from the right channel Rch is larger than the number of sine waves extracted from the left channel Lch, the setter 52 will set a default value as the object.

Now, the to-be-correlated object setter 52 supplies the index [i] having been set as above to the to-be-correlated object selector 56 as will be described with reference to FIG. 11 again.

As shown in FIG. 11, the left-channel amplitude information holder 53 indexes a number $N_L$ of sine waves extracted from the left channel Lch by 0 to $N_L-1$, respectively, sequentially starting with the lowest-frequency one, and holds amplitude information and phase information in correspondence to the indexes. Similarly, the right-channel amplitude information holder 54 indexes a number $N_R$ of sine waves extracted from the right channel Rch by 0 to $N_R-1$, respectively, sequentially starting with the lowest-frequency one, and holds amplitude information and phase information in correspondence to the indexes. The storage unit 55 holds the preset default values. The default values should preferably be set to an intermediate value of possible amplitude information, a mean value determined based on the frequency of appearance or the highest frequency of appearance. By setting the default value to such a value, it is expectable that the difference calculated as will be described later will take a smaller value.

The to-be-correlated object selector 56 selects an object which is to be subtracted from the i-th right-channel amplitude information according to the index [i] supplied from the to-be-correlated object setter 52. More particularly, when the index [i] is −1, the to-be-correlated object selector 56 reads the preset default value from the storage unit 55. When the index [i] is other than −1, the selector 56 will read the index [i]-th amplitude information from the left-channel amplitude information holder 53. The to-be-correlated object selector 56 supplies the amplitude information or default value thus read to the adder-subtracter 57.

The adder-subtracter 57 calculates a difference by subtracting the index [i]-th amplitude information on the left-channel Lch supplied from the right-channel amplitude information holder 54 or default value from the i-th amplitude information read from the left-channel to-be-correlated object selector 56, and supplies the difference thus calculated to the variable-length encoder 58.

The variable-length encoder 58 makes variable-length coding of the difference supplied from the adder-subtracter 57 according to the variable-length code table to generate a variable-length code of the difference of the amplitude information on the right channel Rch.

Figures 1, 2:
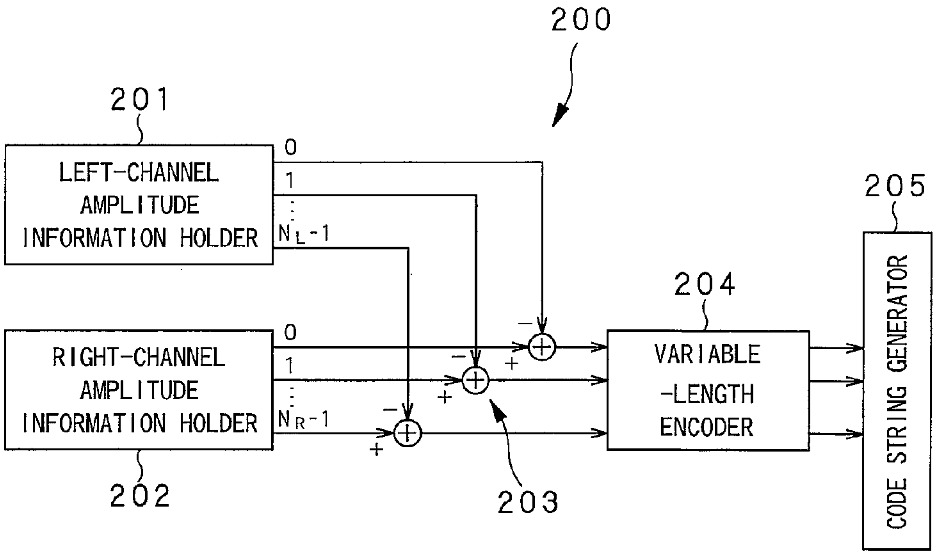
FIG. 1 schematically illustrates the conventional sine wave information encoder.
FIG. 2 shows an example of sine wave information on right and left channels.

The aforementioned technique of coding will be used here to check the efficiency of coding when the sine wave information as shown in FIGS. 2 and 6 is supplied. It should be noted that in this example, the amplitude information and phase information are to be encoded with 3 bits, respectively, when they have not been compressed.

First, it is assumed that the sine wave information is given as shown in FIG. 2. For encoding amplitude information with the use of the encoding technique according to the present invention, amplitude information on the left channel Lch, indexed by n (=0, 1, 2, 3), respectively, are set as objects which are to be subtracted from amplitude information on the right channel Rch, also indexed by n (=0, 1, 2, 3), respectively. Thus, the difference resulted from subtraction of the amplitude information on the left channel Lch from the amplitude information on the right channel Rch will be as shown in FIG. 13. By encoding the difference using the variable-length code table shown in FIG. 4, it is possible to encode the amplitude information on the right channel Rch with a total of 5 bits. This number of bits is 7 bits smaller than 12 bits (=3 bits×4) when the phase information is not compressed.

Similarly, for encoding phase information, phase information on the left channel Lch, indexed by n (=0, 1, 2, 3), respectively, are set as objects which are to be subtracted from phase information on the right channel Rch, also indexed by n (=0, 1, 2, 3), respectively. Thus, the difference resulted from subtraction of the phase information on the left channel Lch from the phase information on the right channel Rch will be as shown in FIG. 14. By encoding the difference using the variable-length code table shown in FIG. 4, it is possible to encode the phase information on the right channel Rch with a total of 5 bits. This number of bits 7 bits smaller than 12 bits (=3 bits×4) when the phase information is not compressed.

Next, it is assumed that the sine wave information is given as shown in FIG. 6. For encoding amplitude information with the use of the encoding technique according to the present invention, amplitude information on the left channel Lch, indexed by n=0 and 1, respectively, are set as objects which are to be subtracted from amplitude information on the right channel Rch, indexed by n=1 and 2, respectively. A default value is se to 4 for example as an object to be subtracted from the amplitude information on the right channel Rch, indexed by n=2, while amplitude information on the left channel Lch, index by n=3, is as an object to be subtracted from the amplitude information on the right channel Rch, also indexed by n=3. Thus, the difference resulted from subtraction of the amplitude information on the left channel Lch or default value from the amplitude information on the right channel Rch, corresponding to the left0channel amplitude information or the default value, will be as shown in FIG. 15. By encoding the difference using the variable-length code table shown in FIG. 4, it is possible to encode the amplitude information on the right channel Rch with a total of 5 bits. This number of bits is 9 bits smaller than 14 bits which can be attained with the conventional technique as shown in FIG. 7, and 7 bits smaller than 12 bits when the phase information is not compressed.

Similarly, for encoding phase information, phase information on the left channel Lch, indexed by n=0 and 1, respectively, are set as objects which are to be subtracted from phase information on the right channel Rch, indexed by n=1 and 2, respectively. A default value is se to 4 for example as an object to be subtracted from the phase information on the right channel Rch, indexed by n=2, while phase information on the left channel Lch, having an index n=3, is as an object to be subtracted from the phase information on the right channel Rch, also indexed by n=3. Thus, the difference resulted from subtraction of the phase information on the left channel Lch or default value from the phase information on the right channel Rch, corresponding to the left0channel phase information or the default value, will be as shown in FIG. 16. By encoding the difference using the variable-length code table shown in FIG. 4, it is possible to encode the phase information on the right channel Rch with a total of 7 bits. This number of bits is 17 bits smaller than 24 bits which can be attained with the conventional technique as shown in FIG. 8, and 5 bits smaller than 12 bits when the phase information is not compressed.

Next, the construction and operation of the sine wave information decoder 38 which decodes a sine wave information code will be described in detail below. It should be noted that although the description of the construction and operation will be made concerning amplitude information similarly to the sine wave information encoder 13, it is also quite true of phase information.

Figure 17:
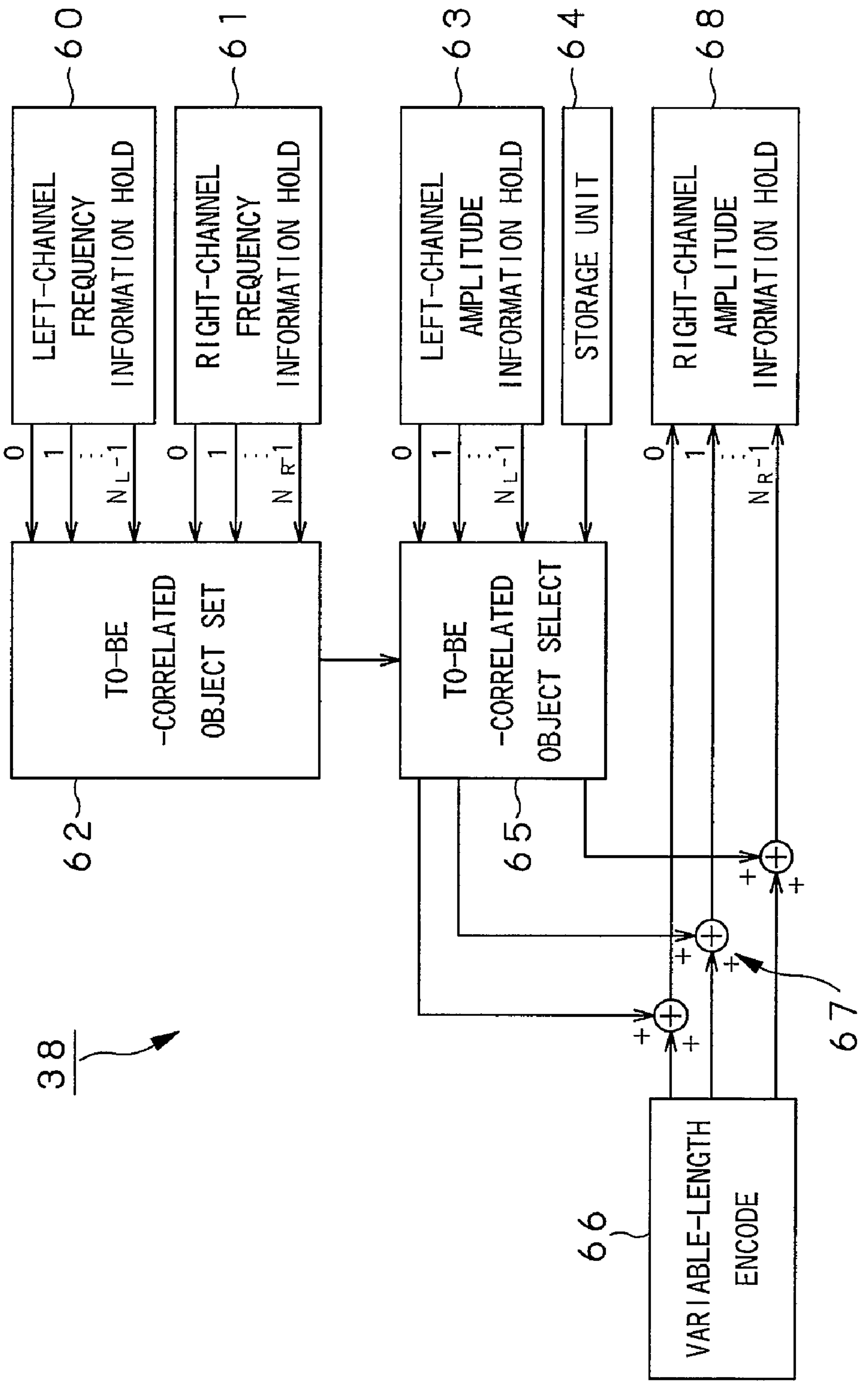
FIG. 17 schematically illustrates a portion of the sine wave information decoder included in the sound signal decoder according to the present invention, that decodes amplitude information on the right channel Rch.

A portion of the sine wave information decoder 38, that decodes amplitude information on the right channel Rch, is schematically illustrated in FIG. 17. As shown in FIG. 17, the sine wave information decoder 38 includes a left-channel frequency information holder 60, right-channel frequency information holder 61, to-be-correlated object setter 62, left-channel amplitude information holder 63, storage unit 64, to-be-correlated object selector 65, variable-length decoder 66, adder 67 and a right-channel amplitude information holder 68.

The left-channel frequency information holder 60 indexes a number $N_L$ of sine waves extracted from the left channel Lch by 0 to $N_L-1$, respectively, sequentially starting with the lowest-frequency one, and holds the sine waves in correspondence to the indexes. Similarly, the right-channel amplitude information holder 61 indexes a number $N_R$ of sine waves extracted from the right channel Rch 0 to $N_R-1$, respectively, to by sequentially starting with the lowest-frequency one, and holds the sine waves in correspondence to the indexes.

Similarly to the aforementioned to-be-correlated object setter 52 in the sine wave information encoder 13, the to-be-correlated object setter 62 sets one of sine waves on the left-channel Lch, that is to be paired, namely, correlated, with a sine wave on the right channel Rch, from which the left-channel sine wave is to be subtracted, on the basis of the number $N_L$ of left-channel frequency information held in the left-channel frequency information holder 60 and the number $N_R$ of right-channel frequency information held in the right-channel frequency information holder 61. An index [i] thus provided indicates either the order of the amplitude information on the left channel Lch, which has been subtracted from the i-th amplitude information on the right channel Rch, or a default value. The to-be-correlated object setter 62 supplies the index [i] thus set to the to-be-correlated object selector 65.

The left-channel amplitude information holder 63 indexes the number $N_L$ of sine waves extracted from the left channel Lch by 0 to $N_L-1$, respectively, sequentially starting with the lowest-frequency one, and holds the sine waves in correspondence to the indexes. The storage unit 64 will hold a pre-set default value. The default value takes the same value as that held in the aforementioned storage unit 55 included in the sine wave information encoder 13.

Similarly to the aforementioned to-be-correlated object selector 56 in the sine wave information encoder 13, the to-be-correlated object selector 65 selects an object having been subtracted from the right-channel i-th amplitude information according to the index [i] supplied from the to-be-correlated object setter 62. More particularly, when the index [i] is −1, the to-be-correlated object selector 65 reads the preset default value from the storage unit 64. In any other case, the to-be-correlated object selector 65 will read the index [i]-th amplitude information from the left-channel amplitude information holder 63. The to-be-correlated object selector 65 supplies the amplitude information or default value thus read to the adder 67.

The variable-length decoder 66 make variable-length coding of a variable-length code of the difference of the amplitude information on the right channel Rch, included in the code string, and supplies the difference of the amplitude information on the right channel Rch, thus obtained, to the adder 67.

The adder 67 adds the index [i]-th amplitude information on the left channel Lch or default value supplied from the to-be-correlated object selector 65 to the difference on the i-th amplitude information on the right channel Rch, supplied from the variable-length decoder 66 to decode the i-th amplitude information on the right channel Rch. The adder 67 restores all the $N_R$ pieces of amplitude information 0 to $N_R-1$ on the right channel Rch in the similar manner, and supplies them to the right-channel amplitude information holder 68.

Since the sine wave information decoder 38 can set a to-be-correlated object on the basis of frequency information, if preset, so it is not necessary to append any information indicative of a to-be-correlated object to the code string. In the above technique of decoding, however, amplitude information and phase information on the left channel Lch have to be decoded before decoding the amplitude information and phase information on the right channel Rch.

Figure 18:
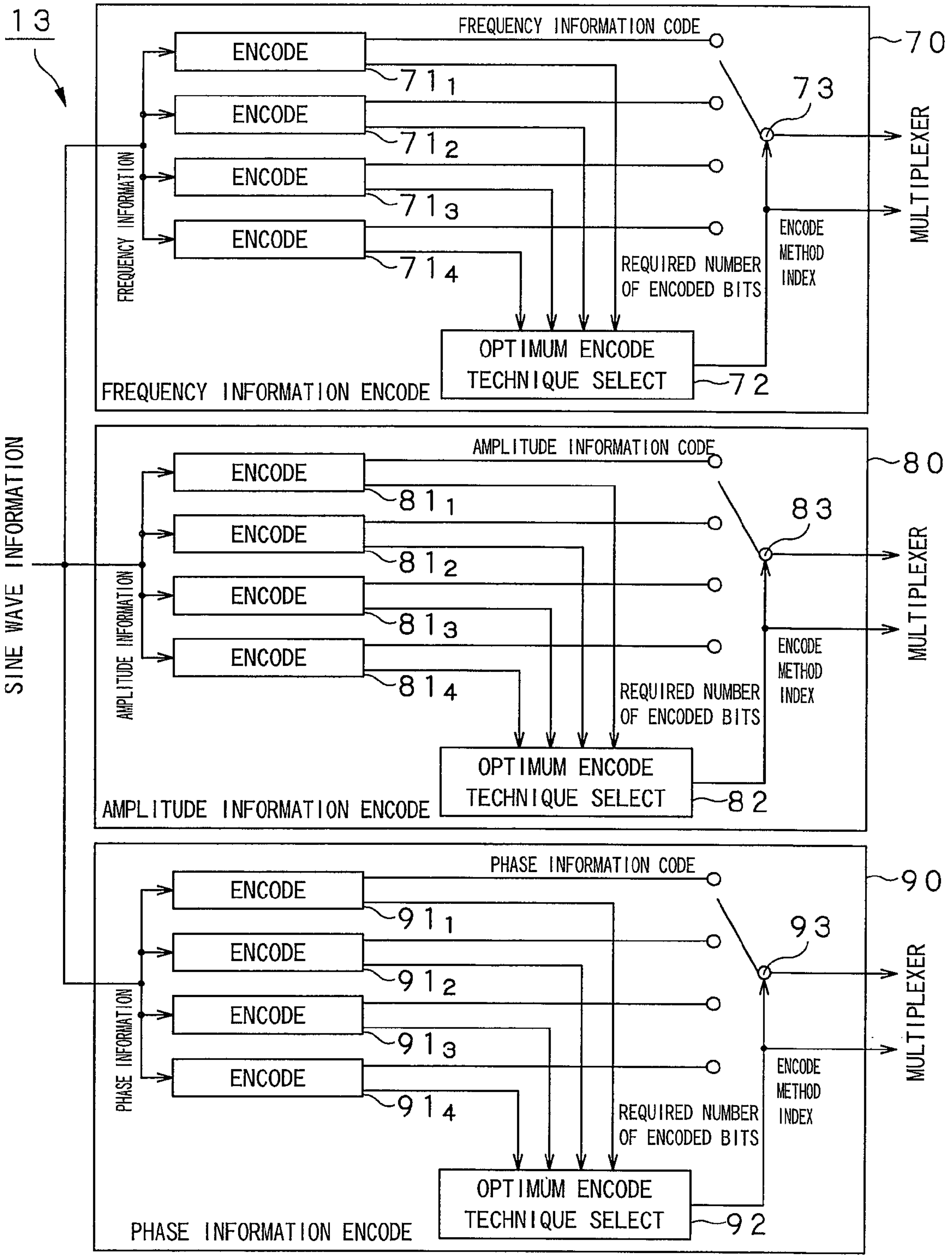
FIG. 18 illustrates, as one example, the entire sine wave information encoder.

The sine wave information encoder 13 may be composed mainly of a frequency information encoder 70, amplitude information encoder 80 and a phase information encoder 90 as shown in FIG. 18.

The frequency information encoder 70 includes encoders $\mathbf{71}_1$ to $\mathbf{71}_4$. The encoders $\mathbf{71}_1$ to $\mathbf{71}_4$ encode frequency information with different techniques of coding, respectively, and supply frequency information codes thus generated to a terminal thereof connected to a switch 73. Each of the encoders $\mathbf{71}_1$ to $\mathbf{71}_4$ calculates a required number of encoding bits as a result of the frequency information coding, and supplies the result of calculation to an optimum encoding technique selector 72. The optimum encoding technique selector 72 selects one of the encoders $\mathbf{71}_1$ to $\mathbf{71}_4$ that has supplied a smallest one of the required numbers of encoding bits supplied from the encoders $\mathbf{71}_1$ to $\mathbf{71}_4$, and controls the switch 73 so that the frequency information encoded by the encoder 71 will be supplied to the multiplexer 21 (as in FIG. 9). The optimum encoding technique decider 72 supplies an index for the encoding technique taken by the selected encoder 71 to the multiplexer 21.

The amplitude information encoder 80 includes encoders $\mathbf{81}_1$ to $\mathbf{81}_4$. The encoders $\mathbf{81}_1$ to $\mathbf{81}_4$ encode amplitude information with different techniques of coding, respectively, and supply amplitude information codes thus generated to a terminal thereof connected to a switch 83, and a required number of encoding bits as the result of encoding to an optimum encoding technique selector 82. The optimum encoding technique selector 82 selects one of the encoders $\mathbf{81}_1$ to $\mathbf{81}_4$ that has supplied a smallest one of the required numbers of encoding bits supplied from the encoders $\mathbf{81}_1$ to $\mathbf{81}_4$, and controls the switch 83 so that the amplitude information encoded by the encoder 81 will be supplied to the multiplexer 21 (as in FIG. 9). The optimum encoding technique decider 82 supplies an index for the encoding technique taken by the selected encoder 81 to the multiplexer 21.

The phase information encoder 90 includes encoders $\mathbf{91}_1$ to $\mathbf{91}_4$. The encoders $\mathbf{91}_1$ to $\mathbf{91}_4$ encode phase information with different techniques of coding, respectively, and supply phase information codes thus generated to terminals thereof connected to a switch 93, and a required number of encoding bits as the result of encoding to an optimum encoding technique selector 92. The optimum encoding technique selector 92 selects one of the encoders $\mathbf{91}_1$ to $\mathbf{91}_4$ that has supplied a smallest one of the required numbers of encoding bits supplied from the encoders $\mathbf{91}_1$ to $\mathbf{91}_4$, and controls the switch 93 so that the phase information encoded by the encoder 91 will be supplied to the multiplexer 21 (as in FIG. 9). The optimum encoding technique decider 92 supplies an index for the encoding technique taken by the selected encoder 91 to the multiplexer 21.

The method of encoding sine wave information according to the present invention is applicable one of the plurality of encoding techniques in the amplitude information encoder 80 and phase information encoder 90. It should be noted that it is assumed that frequency information (not shown) is supplied along with the amplitude information and phase information to the amplitude information encoder 80 and phase information encoder 90. It has been described above that each of the frequency information encoder 70, amplitude information encoder 80 and phase information encoder 90 has four different techniques of coding. However, it is just an example. The present invention is not limited to the example.

In case the right and left channels are coincident in amplitude or phase information with each other, the encoding of amplitude or phase information on the right channel Rch, for example, may be omitted and only an index for the technique of coding be supplied to the multiplexer 21.

For example, it is assumed here that the sine wave information is given as shown in FIG. 19. With the conventional technique of coding, the difference in information between the right and left channels is effected using the same index. So, the amplitude information on the right channel Rch and that on the left channel Lch are not coincident with each other (FALSE) as shown in FIG. 20, with the result that the technique of coding with supply of only an index for the encoding technique to the multiplexer 21 as above cannot be selected.

With the encoding technique according to the present invention, amplitude information on the left channel Lch, indexed by 0, 1 and 2, respectively, are set as objects to be subtracted from those on the right channel Rch, indexed by 0, 1 and 2, respectively, as shown in FIG. 21. Thus, since all the amplitude on the right channel Rch are coincident with those on the left channel Lch (TRUE), coding of the amplitude information on the right channel Rch may be omitted only with supply of the encoding technique indexes to the multiplexer 21.

The encoding of amplitude information and phase information in sine wave information on one channel as objects to be subjected from corresponding ones on the other has been explained by way of example. Also in case only one of the amplitude information and phase information is coincident with the corresponding one, only the index of the encoding technique may be encoded without encoding the coincident information.

Figure 22:
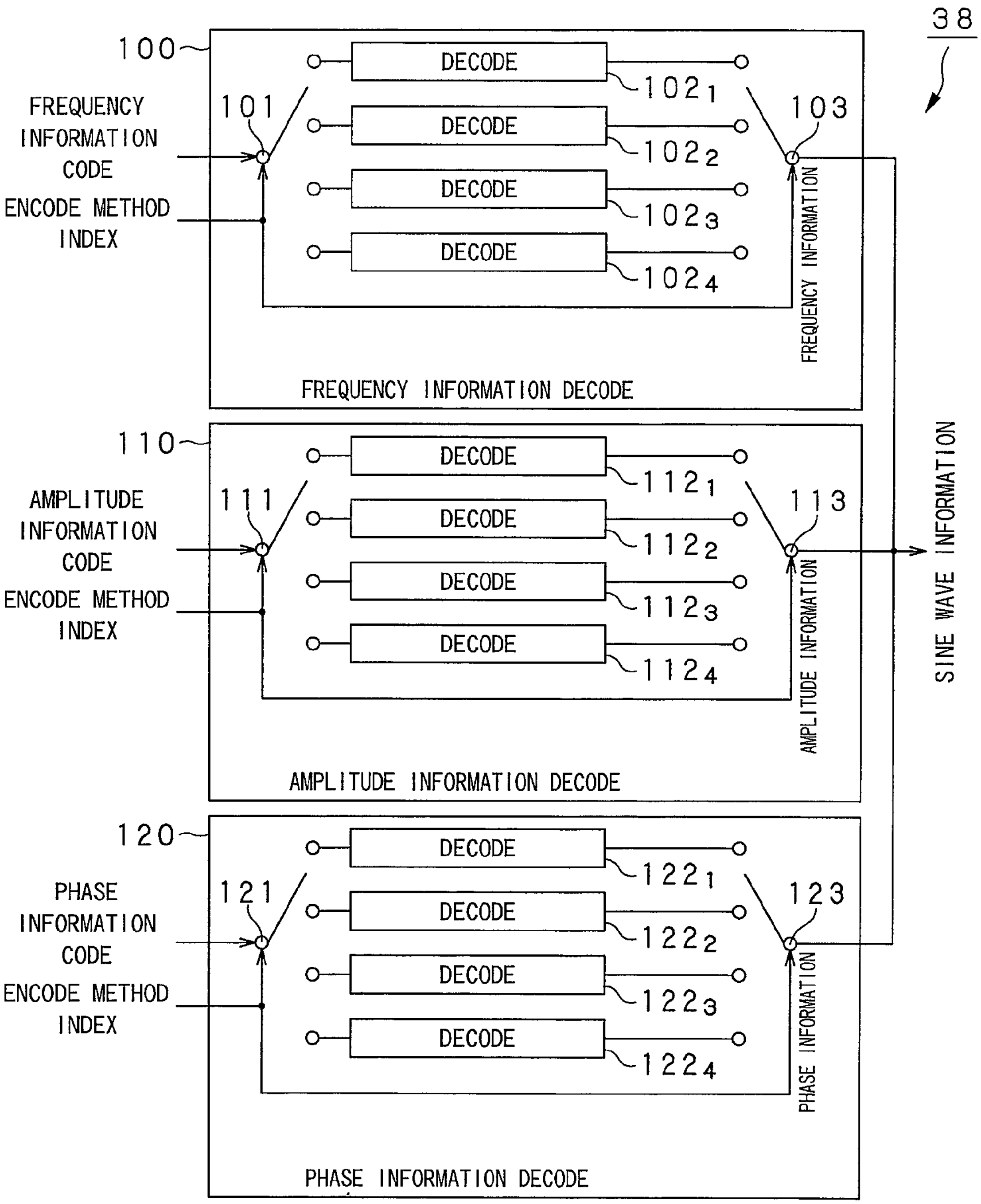
FIG. 22 illustrates, as one example, the entire sine wave information decoder.

Also, the sine wave information decoder 38 may be composed of a frequency information decoder 100, amplitude information decoder 110 and a phase information decoder 120 as shown in FIG. 22.

The frequency information decoder 100 includes a switch 101 which is supplied with a frequency information code and encoding technique index and provides such a control that the frequency information code will be supplied to a decoder 102 corresponding to the encoder 71 selected by the frequency information encoder 70. The decoder 102 includes also decoders $\mathbf{102}_1$ to $\mathbf{102}_4$. The decoders $\mathbf{102}_1$ to $\mathbf{102}_4$ decode the frequency information code with different decoding techniques, respectively, corresponding to the encoders $\mathbf{71}_1$ to $\mathbf{71}_4$ in the frequency information encoder 70. The frequency information decoder 100 includes also a switch 103 which is supplied with an encoding technique index and provides such a control that frequency information decoded by the selected decoder 102 will be supplied.

The amplitude information decoder 110 includes a switch 111 which is supplied with an amplitude information code and encoding technique index and provides such a control that the amplitude information code will be supplied to a decoder 112 corresponding to the encoder 81 selected by the amplitude information encoder 80. The decoder 112 includes also decoders $\mathbf{112}_1$ to $\mathbf{112}_4$. The decoders $\mathbf{112}_1$ to $\mathbf{112}_4$ decode the amplitude information code with different decoding techniques, respectively, corresponding to the encoders $\mathbf{81}_1$ to $\mathbf{81}_4$ in the amplitude information encoder 80. The amplitude information decoder 110 includes also a switch 113 which is supplied with an encoding technique index and provides such a control that amplitude information decoded by the selected decoder 112 will be supplied.

The phase information decoder 120 includes a switch 121 which is supplied with a phase information code and encoding technique index and provides such a control that the phase information code will be supplied to a decoder 122 corresponding to the encoder 91 selected by the phase information encoder 90. The decoder 122 includes also decoders $\mathbf{122}_1$ to $\mathbf{122}_4$. The decoders $\mathbf{122}_1$ to $\mathbf{122}_4$ decode the phase information code with different decoding techniques, respectively, corresponding to the encoders $\mathbf{91}_1$ to $\mathbf{91}_4$ in the phase information encoder 90. The phase information decoder 120 includes also a switch 123 which is supplied with an encoding technique index and provides such a control that phase information decoded by the selected decoder 122 will be supplied.

The method of decoding sine wave information according to the present invention is applicable one of the plurality of encoding techniques in the amplitude information encoder 110 and phase information encoder 120. It has been described above that each of the frequency information decoder 100, amplitude information decoder 110 and phase information decoder 120 has four different techniques of coding. However, it is just an example. The present invention is not limited to the example.

Note that the encoding technique according to the present invention is applicable not only to the coding of aforementioned sine wave information but to coding of other information, for example, the gain control information as the gain control information encoder 15 shown in FIG. 9.

As disclosed in the specification and drawings of the Japanese Patent Application No. 2001-182093 the Inventors of the present invention already filed, the gain controllers $\mathbf{14}_1$ to $\mathbf{14}_n$ detect whether there exists in a signal in a block an attack part that suddenly rises in level or a release part, following the attack part, that suddenly falls in level. If such an attack part or release part exists, the gain controllers $\mathbf{14}_1$ to $\mathbf{14}_n$ generate gain-controlled amount information indicating a gain-controlled amount corresponding to a signal level of a part existing temporally before the attack part and low in level or the level of the release part, gain-controlled position information indicating a position where the gain is controlled correspondingly to the gain-controlled amount and information on gain-controlled number of parts indicating a number of gain-controlled parts as gain control information.

The gain control information encoder 15 encodes the above gain control information. At this time, with the gain-controlled position information being taken as the aforementioned frequency information in the sine wave information and gain-controlled amount information being taken as the aforementioned amplitude or phase information, the gain control information can be encoded.

Figure 23:
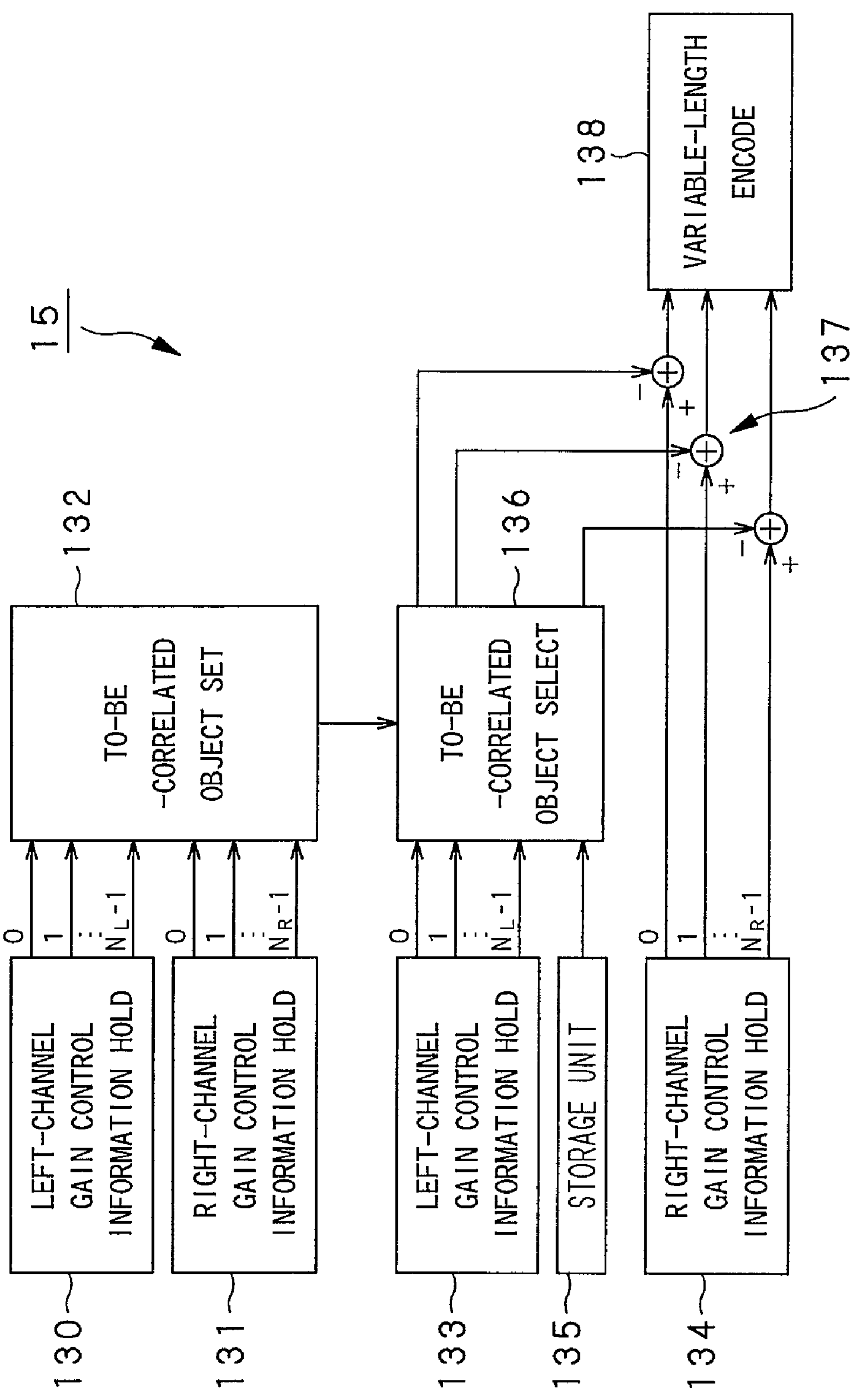
FIG. 23 schematically illustrates a portion of the gain control information encoder included in the sound signal encoder according to the present invention, that encodes gain control information on the right channel Rch.

Of the gain control information encoder 15, a part which encodes the gain-controlled amount information on the right channel Rch is schematically illustrated in FIG. 23. The gain control information encoder 15 is composed of a left-channel gain-controlled position information holder 130, right-channel gain-controlled position information holder 131, to-be-correlated object setter 132, left-channel gain-controlled amount information holder 133, right-channel gain-controlled amount information holder 134, storage unit 135, to-be-correlated object selector 136, adder-subtracter 137 and a variable-length encoder 138 as shown in FIG. 23.

Since the technique of encoding the gain-controlled amount information on the right channel Rch in the gain control information encoder 15 is similar to the aforementioned technique of encoding amplitude or phase information, so it will not be described in detail. Briefly, it is such that a to-be-correlated object is set on the basis of indexed gain-controlled position information on the right and left channels and a difference resulted from subtraction of gain-controlled amount information being the correlated object on the left channel Lch from gain-controlled amount information on the right channel Rch is subjected to variable-length coding.

Figure 28:
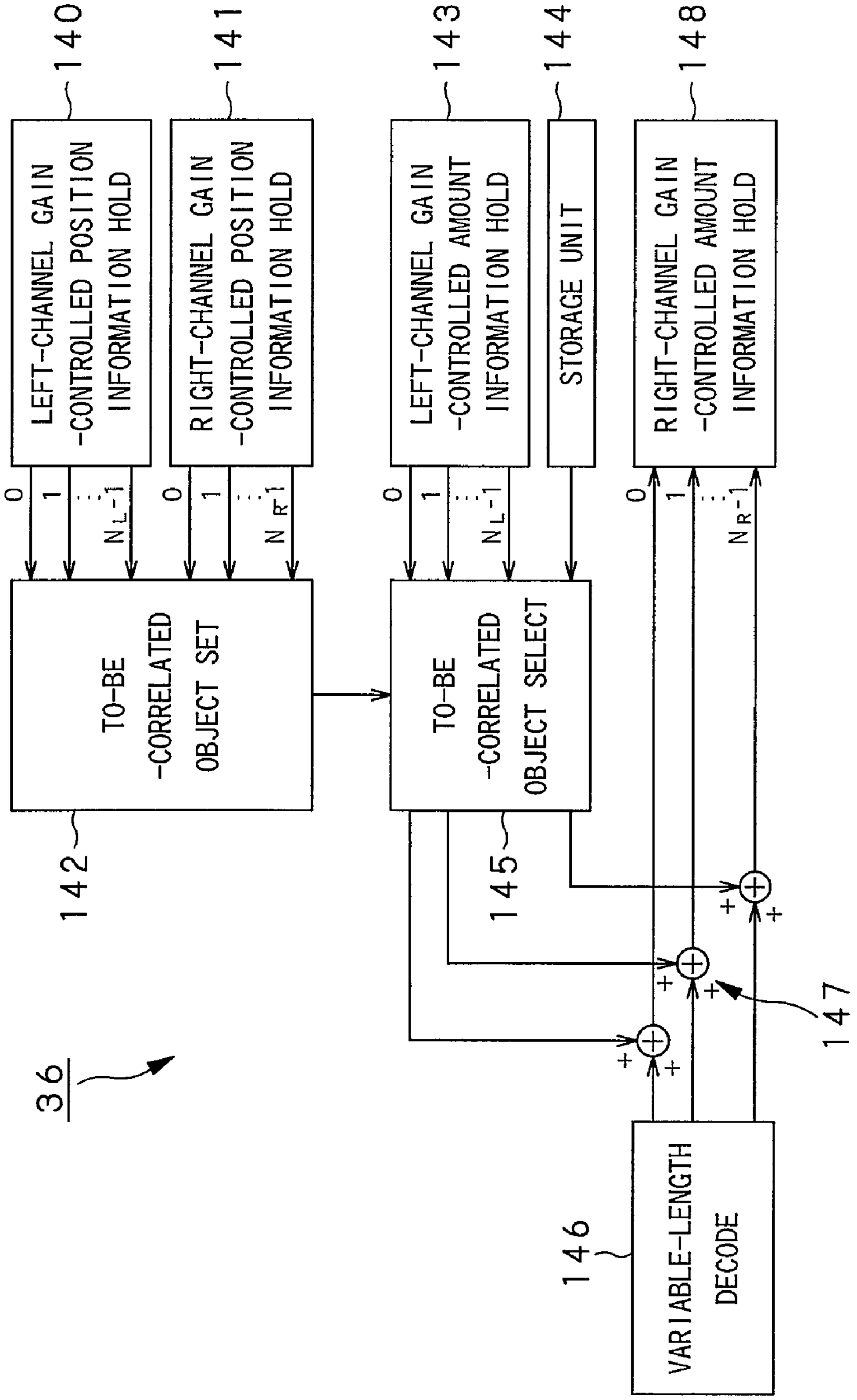
FIG. 28 schematically illustrates a portion of the gain control information decoder included in the sound signal decoder according to the present invention, that decodes gain control information on the right channel Rch.

It is assumed here that gain control information is given as shown in FIG. 28. For encoding gain-controlled amount information, the conventional technique of coding calculates a difference between information having the same indexes. So, the difference resulted from subtraction of gain-controlled amount information on the left channel Lch, having an index n, from gain-gain controlled amount information on the right channel Rch, having the same index n, will be as shown in FIG. 25. By making variable-length coding of the difference according to the variable-length code table as shown in FIG. 26, for example, the gain-controlled amount information on the right channel Rch can be encoded with a total of 10 bits.

With the encoding method according to the present invention, gain-controlled amount information on the left channel Lch, indexed by 0, 2, 3 and 3, respectively, are set as objects to be subtracted from gain-controlled amount information on the right channel Rch, indexed by 0, 1, 2 and 3, respectively. Thus, the difference resulted from subtraction of gain-controlled amount information on the left channel Lch, set as a to-be-correlated object, from corresponding gain-controlled amount information on the right channel Rch is as shown in FIG. 27. By encoding the difference according to the variable-length code table shown in FIG. 26, the gain-controlled amount information on the right channel Rch can be encoded with a total of 6 bits, which is 4 bits more efficient than the convention technique of coding.

On the other hand, of the gain control information decoder 36 (see FIG. 10) which decodes the gain control information code, a part which decodes the gain-controlled amount information on the right channel Rch is schematically illustrated in FIG. 28. The gain control information decoder 36 is composed of a left-channel gain-controlled position information holder 140, right-channel gain-controlled position information holder 141, to-be-correlated object setter 142, left-channel gain-controlled amount information holder 143, storage unit 144, to-be-correlated object selector 145, variable-length decoder 146, adder 147 and a right-channel gain-controlled amount information holder 148, as shown in FIG. 28.

Since the technique of encoding a gain-controlled amount information code on the right channel Rch in the gain control information decoder 36 is similar to the aforementioned technique of encoding an amplitude or phase information code, it will not be described in detail. Briefly, a to-be-correlated object is set on the basis of indexed right- and left-channel gain-controlled position information, and the gain-controlled amount information on the right channel Rch is restored by adding together a difference of gain-controlled amount information on the right channel Rch from corresponding gain-controlled amount information on the left channel Lch and gain-controlled amount information, as an object to be correlated, on the left channel Lch or a default value are added together to restore.

As in the coding of sine wave information, in case all the gain-controlled amounts on the right channel Rch are the same as those on the left channel Lch, the coding of the gain-controlled amount information on the right channel Rch, for example, is omitted and only an encoding technique index may be supplied to the multiplexer 21.

For example, it is assumed here that sine wave information is given as shown in FIG. 29. With the conventional technique of coding, the difference in information between the right and left channels is effected using the same index. So, the gain-controlled amount information on the right channel Rch and that on the left channel Lch are not coincident with each other (FALSE) as shown in FIG. 30, with the result that the technique of coding with supply of only an index for the encoding technique to the multiplexer 21 as above cannot be selected.

With the encoding technique according to the present invention, gain-controlled amount information on the left channel Lch, indexed by 1, 2 and 3, respectively, are set as objects to be subtracted from those on the right channel Rch, indexed by 0, 1 and 2, respectively, as shown in FIG. 31. Thus, since all the gain-controlled amount information on the right channel Rch are coincident with those on the left channel Lch (TRUE), coding of the gain-controlled amount information on the right channel Rch may be omitted only with supply of the encoding technique indexes to the multiplexer 21.

Note that the present invention is not limited to the embodiments having been described in the foregoing but it can of course be modified in various other forms without departing from the scope and spirit thereof.

The sound signal encoder according to the present invention has been described as a one which encodes an audio signal divided into frequency subbands, extracting a sine wave such as tone component from the audio-signal subbands, encoding the sine wave information and making spectrum transform of a residual signal of the audio signal from which the sine wave has been extracted. However, the present invention is not limited to the sound signal encoder thus constructed but it is applicable to a sound signal encoder which does not divide an audio signal into frequency subbands and encode such a residual signal.

Also, the amplitude information encoder and phase information encoder have been described as separate units, but according to the present invention, the they may be constructed to use one to-be-correlated object setter and one to-be-correlated selector in common for encoding the amplitude information and phase information.

Also, the present invention has been described as a hardware, but it is not limited to the hardware. Any of the operations in the sound signal encoder may be effected by allowing the CPU (central processing unit) to perform a computer program. In this case, the computer program may be provided via a recording medium having it recorded therein, or by distribution via an transmission medium such as the Internet.

In the foregoing, the present invention has been described in detail concerning certain preferred embodiments thereof as examples with reference to the accompanying drawings. However, it should be understood by those ordinarily skilled in the art that the present invention is not limited to the embodiments but can be modified in various manners, constructed alternatively or embodied in various other forms without departing from the scope and spirit thereof as set forth and defined in the appended claims.

INDUSTRIAL APPLICABILITY

As having been described in the foregoing, the present invention provides the sound signal encoding method, in which in encoding sound signals from a plurality of channels, an arbitrary number of sine waves are extracted from each of the sound signals from the plurality of channels, first-channel information including sine wave information standing on a sine wave extracted from a first one of the plurality of channels and second-channel information including sine wave information standing on a sine wave extracted from a second one of the plurality of channels or sine wave information standing on a predetermined sine wave are used to set one of the sine wave information in the second-channel information or the sine wave information standing on the predetermined sine wave as a to-be-correlated object for encoding in correlation with each sine wave information in the first-channel information, the sine wave information in the second-channel information is encoded and the sine wave information in the first-channel information is encoded using the correlation with the sine wave information set as the to-be-correlated object.

By the above sound signal encoding method and the sound signal encoding apparatus adopting the method, in order to encode sine wave information from a first channel can be encoded with an improved efficiency by setting one of sine wave information from a second channel or predetermined sine wave information as a to-be-correlated object in correlation with the first-channel sine wave information, and encoding the first-channel sine wave information using the correlation with the sine wave information as the to-be-correlated object.

Also the present invention provides the sound signal decoding method and apparatus, in which in restoring sound signals from a plurality of channels by decoding a sine wave information code obtained by extracting an arbitrary number of sine waves from each of the sound signals from the plurality of channels, using first-channel information including sine wave information standing on a sine wave extracted from a first one of the plurality of channels and second-channel information including sine wave information standing on a sine wave extracted from a second one of the plurality of channels or sine wave information standing on a predetermined sine wave to set one of the sine wave information in the second-channel information or the sine wave information standing on the predetermined sine wave as a to-be-correlated object for encoding in correlation with each sine wave information in the first-channel information, encoding the sine wave information in the second-channel information and encoding the sine wave information in the first-channel information using the correlation with the sine wave information set as the to-be-correlated object, the sine wave information in the encoded second-channel information is decoded, the sine wave information in the encoded first-channel information is decoded using the correlation with the sine wave information set as the to-be-correlated object, and the sound signals from the plurality of channels are restored on the basis of the sine wave information in the first-channel information and sine wave information in the second-channel information.

By the above sound signal decoding method and apparatus, the encoded first-channel sine wave information can be decoded using the correlation with one of the second-channel sine wave information or predetermined sine wave information and without information indicating any object set at the encoding side, by decoding the encoded second-channel sine wave information and then decoding the encoded first-channel sine wave information using the correlation with the sine wave information set as the to-be-correlated object.

Also the present invention provides the sound signal encoding method and apparatus, in which in encoding sound signals from a plurality of channels, an arbitrary number of gain control information are generated correspondingly to the amplitude of the sound signals from the plurality of channels for gain control of the sound signals, the gain control information generated for the first-channel sound signal and gain control information generated for the second-channel sound signal are used to set one of the second-channel gain control information or predetermined gain control information as an to-be-correlated object for encoding in correlation with each first-channel gain control information, the second-channel gain control information is encoded, and the first-channel gain control information is encoded using the correlation with the gain control information set as the to-be-correlated object.

By the above sound signal encoding method and apparatus, the first-channel gain control information can be encoded with an improved efficiency by setting one of the second-channel gain control information or predetermined gain control information as the to-be-correlated object in correlation with the first-channel gain control information, and encoding the first-channel gain control information using the correlation with the gain control information as the to-be-correlated object.

Also the present invention provides the sound signal decoding method and apparatus, in which in restoring sound signals from a plurality of channels by decoding a gain control information code obtained by generating an arbitrary number of gain control information correspondingly to the amplitude of the sound signals from the plurality of channels for gain control of the sound signals, using the gain control information generated for the first-channel sound signal and gain control information generated for the second-channel sound signal to set one of the second-channel gain control information or predetermined gain control information as an to-be-correlated object for encoding in correlation with each first-channel gain control information, encoding the second-channel gain control information, and encoding the first-channel gain control information using the correlation with the gain control information set as the to-be-correlated object, the encoded second-channel gain control information is decoded, the encoded first-channel gain control information is decoded using the correlation with the gain control information set as the to-be-correlated object, and gain control correction is made on the basis of the first-channel information and second-channel gain control information.

By the above sound signal decoding method and apparatus, the encoded first-channel gain control information can be decoded using the correlation with one of the second-channel gain control information or predetermined gain control information by decoding the encoded second-channel gain control information and then decoding the encoded first-channel gain control information using the correlation with the gain control information set as the to-be-correlated object.

Also the present invention provides the program allowing a computer to execute the above sound signal encoding or decoding. Also the present invention provides the computer-readable recording medium having the program recorded therein.

The above program and recording medium enable implementation of the aforementioned sound signal encoding or decoding by a software Also the present invention provides the recording medium having a sine wave information code or gain control information code obtained through the sound signal encoding.

The invention claimed is:

1. A method of encoding sound signals from a plurality of channels using a sound signal encoder, said sound signal encoder comprising a plurality of gain controllers and a to-be-correlated object setter, the method comprising the steps of:

generating, with the gain controllers, an arbitrary number of gain control information correspondingly to the amplitude of the sound signals from the plurality of channels for gain control of the sound signals;

setting, using the gain control information generated for a first-channel sound signal and gain control information generated for a second-channel sound signal, one of the second-channel gain control information or predetermined gain control information as a to-be-correlated object for encoding in correlation with each first-channel gain control information; and encoding the second-channel gain control information, and encoding the first-channel gain control using the correlation with the gain control information set as the to-be-correlated object, wherein in the to-be-correlated object setting step, gain control information as the to-be-correlated object is set on the basis of a time-based distance between gain-controlled position information included in the first-channel gain control information and gain-controlled position information included in the second-channel gain control information.

2. The method as set forth in claim 1, wherein in the to-be-correlated object setting step, there is set as the to-be-correlated object second-channel gain control information including gain-controlled position information whose time-based distance from the gain-controlled position information included in the first-channel gain control information is less than a threshold.

3. The method as set forth in claim 2, wherein in the to-be-correlated object setting step, arbitrary gain control information included in the second-channel gain control information is set as the to-be-correlated object in case there is no second-channel gain control information including gain-controlled position information whose time-based distance from the gain-controlled position information included in the first-channel gain control information is less than the threshold.

4. The method as set forth in claim 2, wherein in the to-be-correlated object setting step, the predetermined gain control information is set as the to-be-correlated object in case there is no second-channel gain control information including gain-controlled position information whose time-based distance from the gain-controlled position information included in the second-channel gain control information is less than the threshold.

5. The method as set forth in claim 1, wherein:

the gain control information includes gain-controlled amount; and in the gain control information encoding step, a difference resulted from subtraction of gain-controlled amount information included in the gain control information as the to-be-correlated object from gain-controlled amount information included in the first-channel gain control information is subjected to variable-length coding.

6. The method as set forth in claim 1, wherein in the gain control information encoding step, other information than the gain-controlled position information included in the first-channel gain control information is not encoded in case all the first-channel gain control information coincide with those set as the to-be-correlated objects.

7. A sound signal encoder for encoding sound signals from a plurality of channels, the encoder comprising:

a plurality of gain controllers for generating an arbitrary number of gain control information correspondingly to the amplitude of the sound signals from the plurality of channels for gain control of the sound signals;

a to-be-correlated object setter for setting, using a gain control information generated for the first-channel sound signal and gain control information generated for a second-channel sound signal, one of the second-channel gain control information or predetermined gain control information as a to-be-correlated object for encoding in correlation with each first-channel gain control information; and a gain control information encoder for encoding the second-channel gain control information, and encoding the first-channel gain control using the correlation with the gain control information set as the to-be-correlated object, wherein gain control information as the to-be-correlated object is set on the basis of a time-based distance between gain-controlled position information included in the first-channel gain control information and gain-controlled position information included in the second-channel gain control information.

8. A computer-readable recording medium having recorded therein a program for allowing a computer to encode sound signals from a plurality of channels, the program comprising the steps of:

generating an arbitrary number of gain control information correspondingly to the amplitude of the sound signals from the plurality of channels for gain control of the sound signals;

setting, using the gain control information generated for a first-channel sound signal and gain control information generated for a second-channel sound signal, one of the second-channel gain control information or predetermined gain control information as a to-be-correlated object for encoding in correlation with each first-channel gain control information; and encoding the second-channel gain control information, and encoding the first-channel gain control using the correlation with the gain control information set as the to-be-correlated object, wherein in the to-be-correlated object setting step, gain control information as the to-be-correlated object is set on the basis of a time-based distance between gain-controlled position information included in the first-channel gain control information and gain-controlled position information included in the second-channel gain control information.

9. A recording medium having recorded therein a string of codes generated by a method of encoding sound signals from a plurality of channels, the string of codes being gain control information codes obtained by:

generating an arbitrary number of gain control information correspondingly to the amplitude of the sound signals from the plurality of channels for gain control of the sound signals;

setting, using the gain control information generated for a first-channel sound signal and gain control information generated for a second-channel sound signal, one of the second-channel gain control information or predetermined gain control information as a to-be-correlated object for encoding in correlation with each first-channel gain control information; and encoding the second-channel gain control information, and encoding the first-channel gain control using the correlation with the gain control information set as the to-be-correlated object, wherein in the to-be-correlated object setting step, gain control information as the to-be-correlated object is set on the basis of a time-based distance between gain-controlled position information included in the first-channel gain control information and gain-controlled position information included in the second-channel gain control information.

10. A sound signal decoding method of restoring sound signals from a plurality of channels by generating an arbitrary number of gain control information correspondingly to the amplitude of the sound signals from the plurality of channels for gain control of the sound signals; setting, using the gain control information generated for the first-channel sound signal and gain control information generated for the second-channel sound signal, one of the second-channel gain control information or predetermined gain control information as an to-be-correlated object for encoding in correlation with each first-channel gain control information; and encoding the second-channel gain control information and then encoding the first-channel gain control information using the correlation with the gain control information set as the to-be-correlated object, the method comprising the steps of:

decoding the encoded second-channel gain control information and then decoding the encoded first-channel gain control information using the correlation with the gain control information set as the to-be-correlated object; and restoring the sound signals from the plurality of channels by correcting the gain control on the basis of the first-channel information and second-channel gain control information, wherein in the gain control information decoding step, the encoded first-channel gain control information is decoded using gain control information set as the to-be-correlated objected on the basis of a time-based distance between gain-controlled position information included in the first-channel gain control information and gain-controlled position information included in the second-channel gain control information.

11. The method as set forth in claim 10, wherein in the gain control information decoding step, the encoded first-channel gain control information is decoded using the second-channel gain control information whose time-based distance between the gain-controlled position information included in the first-channel gain control information and gain-controlled position information included in the second-channel gain control information is less than a threshold.

12. The method as set forth in claim 11, wherein in the gain control information decoding step, the encoded first-channel gain control information is decoded using arbitrary gain control information included in the second-channel gain control information in case there is no second-channel gain control information including gain-controlled position information whose time-based distance from gain-controlled position information included in the first-channel gain control information is less than the threshold.

13. The method as set forth in claim 11, wherein in the gain control information decoding step, the encoded first-channel gain control information is decoded using the predetermined gain control information in case there is no second-channel gain control information including gain-controlled position information whose time-based distance from gain-controlled position information included in the first-channel gain control information is less than the threshold.

14. The method as set forth in claim 10, wherein:

the encoded first-channel gain control information is derived from variable-length coding of a difference resulted from subtraction of gain-controlled amount information included in gain control information set as the to-be-correlated object from gain-controlled amount information included in gain control information in the first-channel information; and the gain-controlled amount information included in the encoded first-channel gain control information is decoded in the sine wave information decoding step by adding the decoded difference and the gain control information as the to-be-correlated object.

15. The method as set forth in claim 10, wherein in the gain control information decoding step, gain-controlled amount information included in the gain control information set as the to-be-correlated object is used as gain-controlled amount information included in the first-channel gain control information in case the gain-controlled amount information included in the first-channel gain control information has not been encoded.

16. A sound signal decoder for restoring sound signals from a plurality of channels by generating an arbitrary number of gain control information correspondingly to the amplitude of the sound signals from the plurality of channels for gain control of the sound signals; setting, using the gain control information generated for the first-channel sound signal and gain control information generated for the second-channel sound signal, one of the second-channel gain control information or predetermined gain control information as an to-be-correlated object for encoding in correlation with each first-channel gain control information; and encoding the second-channel gain control information and then encoding the first-channel gain control information using the correlation with the gain control information set as the to-be-correlated object, the apparatus comprising:

a gain control information decoding means for decoding the encoded second-channel gain control information and then decoding the encoded first-channel gain control information using the correlation with the gain control information set as the to-be-correlated object; and a sound signal restoring means for restoring the sound signals from the plurality of channel by correcting the gain control on the basis of the first-channel information and second-channel gain control information, wherein the encoded first-channel gain control information is decoded using gain control information set as the to-be-correlated objected on the basis of a time-based distance between gain-controlled position information included in the first-channel gain control information and gain-controlled position information included in the second-channel gain control information.

17. A computer-readable recording medium having recorded therein a program for allowing a computer to restore sound signals from a plurality of channels by generating an arbitrary number of gain control information correspondingly to the amplitude of the sound signals from the plurality of channels for gain control of the sound signals; setting, using the gain control information generated for the first-channel sound signal and gain control information generated for the second-channel sound signal, one of the second-channel gain control information or predetermined gain control information as an to-be-correlated object for encoding in correlation with each first-channel gain control information; and encoding the second-channel gain control information and then encoding the first-channel gain control information using the correlation with the gain control information set as the to-be-correlated object, the program comprising the steps of:

decoding the encoded second-channel gain control information and then decoding the encoded first-channel gain control information using the correlation with the gain control information set as the to-be-correlated object; and restoring the sound signals from the plurality of channels by correcting the gain control on the basis of the first-channel information and second-channel gain control information, wherein in the gain control information decoding step, the encoded first-channel gain control information is decoded using gain control information set as the to-be-correlated objected on the basis of a time-based distance between gain-controlled position information included in the first-channel gain control information and gain-controlled position information included in the second-channel gain control information.

* * * * *